US007432494B2

(12) United States Patent
Kanzaki

(10) Patent No.: US 7,432,494 B2
(45) Date of Patent: Oct. 7, 2008

(54) COLOR IMAGE FORMING APPARATUS AND METHOD OF CONTROLLING THE COLOR IMAGE FORMING APPARATUS THAT EFFICIENTLY PERFORM POSITION DISPLACEMENT DETECTION OPERATION AND DENSITY DETECTION OPERATION

(75) Inventor: Yoshio Kanzaki, Tokyo (JP)

(73) Assignee: Ricoh Company Limited, Tokyo (JP)

( * ) Notice: Subject to any disclaimer, the term of this patent is extended or adjusted under 35 U.S.C. 154(b) by 442 days.

(21) Appl. No.: 11/169,682

(22) Filed: Jun. 30, 2005

(65) Prior Publication Data

US 2006/0002727 A1 Jan. 5, 2006

(30) Foreign Application Priority Data

Jun. 30, 2004 (JP) ............................ 2004-192685
Sep. 7, 2004 (JP) ............................ 2004-259762

(51) Int. Cl.

*G01J 3/50* (2006.01)
*H01L 27/00* (2006.01)
*H01J 3/14* (2006.01)
*G03G 15/01* (2006.01)
*G03G 15/00* (2006.01)
*B41J 2/385* (2006.01)

(52) U.S. Cl. .................... 250/226; 250/208.1; 250/234; 399/301; 399/310; 347/116

(58) Field of Classification Search .............. 250/208.1, 250/226, 201.7, 234–236; 359/2, 320; 382/128, 382/133; 399/301, 110; 347/115, 116
See application file for complete search history.

(56) References Cited

U.S. PATENT DOCUMENTS

2004/0033090 A1* 2/2004 Yamanaka et al. .......... 399/301
2004/0208670 A1* 10/2004 Abe .......................... 399/110

FOREIGN PATENT DOCUMENTS

JP 2002-207338 7/2002
JP 2003-186278 7/2003

* cited by examiner

*Primary Examiner*—Georgia Y. Epps
*Assistant Examiner*—Don Williams
(74) *Attorney, Agent, or Firm*—Oblon, Spivak, McClelland, Maier & Neustadt, P.C.

(57) ABSTRACT

A color image forming apparatus including tandem type image forming units that form images of different colors, respectively. The image forming units form test marks of different colors on a conveyor belt in its conveying direction at predetermined intervals. The test marks include linear position displacement detecting test marks and density detecting test marks. Each of the linear position displacement detecting test marks extends in a direction perpendicular to the conveying direction of the conveyor belt, and each of the density detecting test marks includes an area having a predetermined density and being adjacent to each of the linear position displacement detecting test marks. A detection operation for detecting position displacements of the linear position displacement detecting test marks in a sub-scanning direction of the conveyor belt and a detection operation for detecting densities of the density detecting test marks are performed, based on detection signals output from sensors.

30 Claims, 12 Drawing Sheets

FIG. 14A
FIG. 14B
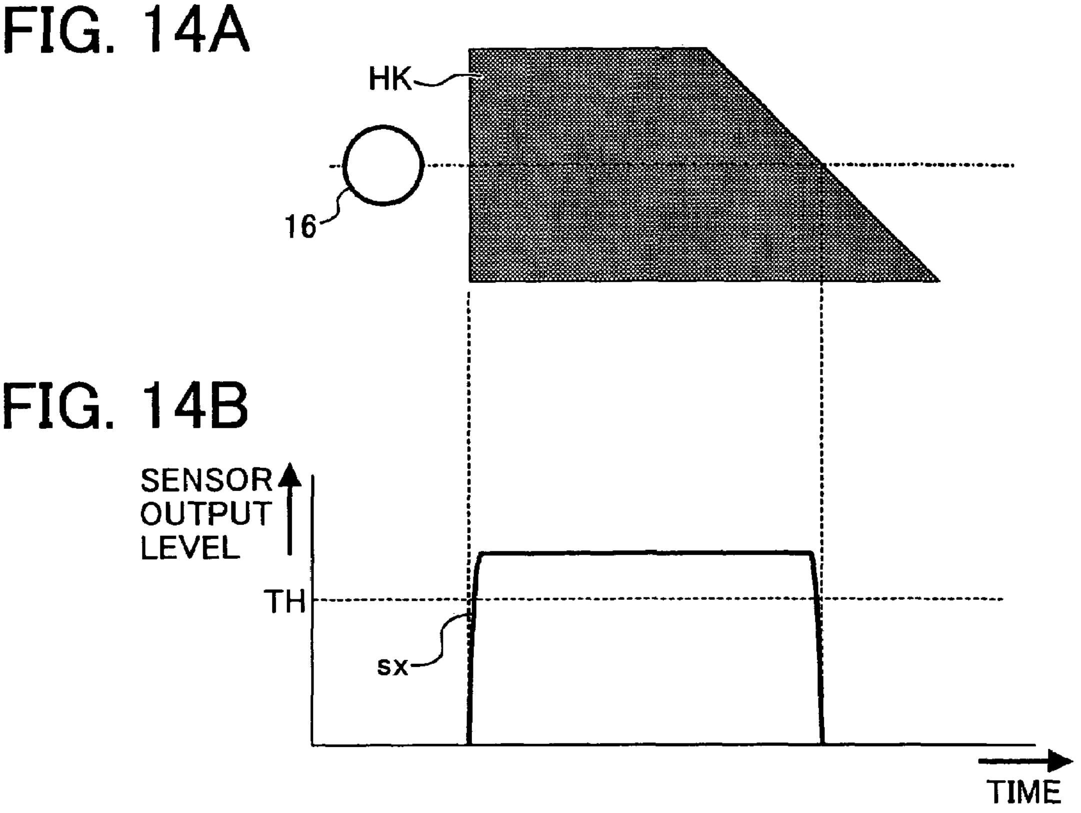
FIG. 15A
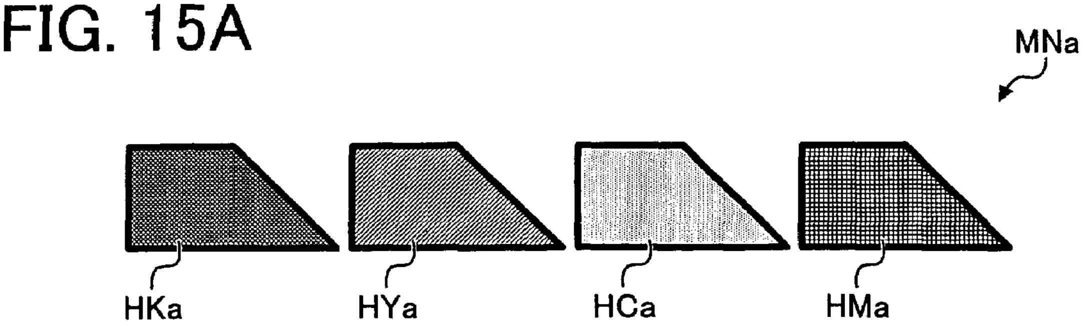
FIG. 15B
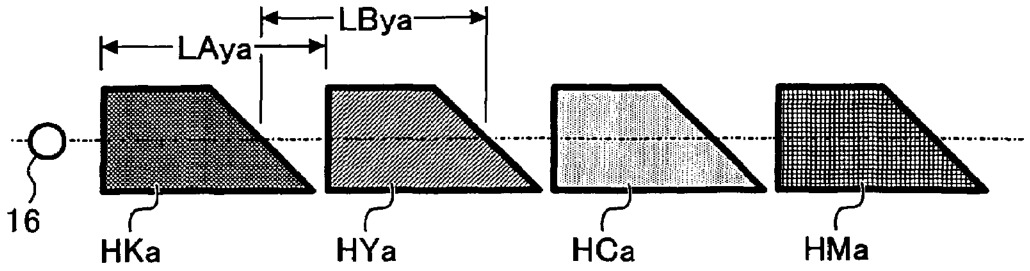

COLOR IMAGE FORMING APPARATUS AND METHOD OF CONTROLLING THE COLOR IMAGE FORMING APPARATUS THAT EFFICIENTLY PERFORM POSITION DISPLACEMENT DETECTION OPERATION AND DENSITY DETECTION OPERATION

CROSS-REFERENCE TO RELATED APPLICATIONS

This application claims priority to Japanese Patent Application No. 2004-192685 filed in the Japanese Patent Office on Jun. 30, 2004, and Japanese Patent Application No. 2004-259762 filed in the Japanese Patent Office on Sep. 7, 2004, the entire contents of which are incorporated by reference herein.

BACKGROUND OF THE INVENTION

1. Field of the Invention

The present invention relates to a color image forming apparatus including tandem type image forming units that form images of different colors, respectively, and are disposed along a conveying direction of a conveyor belt, and including transfer units that transfer the images of different colors formed by the image forming units to the conveyor belt or a transfer sheet conveyed on the convey belt while superimposing each of the images on one another.

2. Discussion of the Background

A so-called tandem-type color image forming apparatus has been widely used. In the tandem-type color image forming apparatus, a plurality of image forming units that respectively form images of different colors are disposed along a conveying direction of a conveyor belt that conveys transfer sheets or images. The images of different colors formed by the image forming units are sequentially transferred to a transfer sheet or the conveyor belt while being superimposed on one another. In this tandem-type color image forming apparatus, when transferring images of different colors to a transfer sheet or a conveyor belt, the images may tend to have displacements relative to each other, resulting in a blurred color image. Therefore, to avoid position displacements among color images, a color image forming position is adjusted by performing position displacement detections every time a predetermined number of prints are output. For example, published Japanese Patent application No. 2002-207338 describes a position displacement detection technique.

In a position displacement detection operation, position displacement detecting test marks are formed on a conveyor belt, and are read by optical sensors. Further, a position displacement detection operation is performed based on a level of a detection signal of each of the optical sensors.

Because image quality is adversely affected not only by position displacements among images but also by density variations among the images, a density of the color image is adjusted by performing image density detections. In an image density detection operation, test marks of all colors are formed on a conveyor belt, and are read by optical sensors which also read test marks formed for a position displacement detection operation. Further, the density of a toner image is adjusted based on a level of a detection signal of each of the optical sensors.

The above-described position displacement detection operation and the image density detection operation are performed by forming different types of test marks. When both the position displacement detection operation and the image density detection operation need to be performed, two types of test marks are formed on the conveyor belt and read by the optical sensors sequentially. It takes time to complete adjustment operations for a color image forming position and for the density of a toner image. Consequently, a user has to wait for some time until a color image forming apparatus becomes ready for image formation.

To reduce the above-described user's waiting time until the completion of adjustment operations for a color image forming position and for the density of a toner image, a background image forming apparatus includes two types of sensors; one for reading test marks formed in the position displacement detection operation, and the other for reading test marks formed in the image density detection operation. However, the cost of the apparatus increases due to the increase in the number of optical sensors.

Therefore, it is desirable to provide a color image forming apparatus and a method of controlling the color image forming apparatus that can efficiently perform a position displacement detection operation and an image density detection operation without increasing the user's waiting time and without incurring an increase in costs.

SUMMARY OF THE INVENTION

The present invention advantageously provides a color image forming apparatus including tandem type image forming units configured to form images of different colors, respectively, and an image carrier configured to carry the images formed by the image forming units. The image forming units are disposed along a conveying direction of the image carrier. The color image forming apparatus further includes transfer units configured to transfer the images of different colors formed by the image forming units to the image carrier while superimposing each of the images on one another. The image carrier includes a conveyor belt, and the image forming units are configured to form test marks of different colors on the conveyor belt in a conveying direction of the conveyor belt at predetermined intervals. The test marks include linear position displacement detecting test marks of different colors and density detecting test marks of different colors. Each of the linear position displacement detecting test marks extends in a direction perpendicular to the conveying direction of the conveyor belt, and each of the density detecting test marks includes an area having a predetermined density and being adjacent to each of the linear position displacement detecting test marks. The color image forming apparatus further includes at least two detectors configured to detect the linear position displacement detecting test marks and the density detecting test marks and to output detection signals, and a controller configured to perform a detection operation for detecting position displacements of the linear position displacement detecting test marks in a sub-scanning direction of the conveyor belt which is equal to the conveying direction of the conveyor belt and to perform a detection operation for detecting densities of the density detecting test marks, based on the detection signals output from the at least two detectors.

The present invention further advantageously provides a color image forming apparatus including tandem type image forming units configured to form images of different colors, respectively, and an image carrier configured to carry the images formed by the image forming units. The image forming units are disposed along a conveying direction of the image carrier. The color image forming apparatus further includes transfer units configured to transfer the images of different colors formed by the image forming units to the image carrier while superimposing each of the images on one another. The image carrier includes a conveyor belt, and the image forming units are configured to form test marks of different colors on the conveyor belt in a conveying direction of the conveyor belt at predetermined intervals. The test marks include linear position displacement detecting test marks of different colors and density detecting test marks of different colors. Each of the linear position displacement detecting test marks extends diagonally by predetermined degrees relative to the conveying direction of the conveyor belt, and each of the density detecting test marks includes an area having a predetermined density and being adjacent to each of the linear position displacement detecting test marks. The color image forming apparatus further includes at least two detectors configured to detect the linear position displacement detecting test marks and the density detecting test marks and to output detection signals, and a controller configured to perform a detection operation for detecting position displacements of the linear position displacement detecting test marks in a main-scanning direction of the conveyor belt which is perpendicular to the conveying direction of the conveyor belt and to perform a detection operation for detecting densities of the density detecting test marks, based on the detection signals output from the at least two detectors.

The present invention further advantageously provides a color image forming apparatus including tandem type image forming units configured to form images of different colors, respectively, and an image carrier configured to carry the images formed by the image forming units. The image forming units are disposed along a conveying direction of the image carrier. The color image forming apparatus further includes transfer units configured to transfer the images of different colors formed by the image forming units to the image carrier while superimposing each of the images on one another. The image carrier includes a conveyor belt, and the image forming units are configured to form test marks of different colors on the conveyor belt in a conveying direction of the conveyor belt at predetermined intervals. The test marks include first linear position displacement detecting test marks of different colors, second linear position displacement detecting test marks of different colors, and density detecting test marks of different colors. Each of the first linear position displacement detecting test marks extends in a direction perpendicular to the conveying direction of the conveyor belt, each of the second linear position displacement detecting test marks extends diagonally by predetermined degrees relative to the conveying direction of the conveyor belt, and each of the density detecting test marks includes an area having a predetermined density and being formed between each of the first linear position displacement detecting test marks and each of the second linear position displacement detecting test marks. The color image forming apparatus further includes at least two detectors configured to detect the first linear position displacement detecting test marks, the second linear position displacement detecting test marks, and the density detecting test marks and to output detection signals. The color image forming apparatus also includes a controller configured to perform a detection operation for detecting position displacements of the first linear position displacement detecting test marks in a sub-scanning direction of the conveyor belt which is equal to the conveying direction of the conveyor belt, to perform a detection operation for detecting position displacements of the second linear position displacement detecting test marks in a main-scanning direction of the conveyor belt which is perpendicular to the conveying direction of the conveyor belt, and to perform a detection operation for detecting densities of the density detecting test marks, based on the detection signals output from the at least two detectors.

The present invention further advantageously provides a method of controlling a color image forming apparatus that forms images of different colors and transfers the images of different colors to an image carrier while superimposing each of the images on one another. The method includes forming test marks of different colors on a conveyor belt of the image carrier in a conveying direction of the conveyor belt at predetermined intervals. The test marks include linear position displacement detecting test marks of different colors and density detecting test marks of different colors. Each of the linear position displacement detecting test marks extends in a direction perpendicular to the conveying direction of the conveyor belt, and each of the density detecting test marks includes an area that has a predetermined density and is adjacent to each of the linear position displacement detecting test marks. The method further includes detecting the linear position displacement detecting test marks and the density detecting test marks and outputting detection signals, and performing a detection operation for detecting position displacements of the linear position displacement detecting test marks in a sub-scanning direction of the conveyor belt which is equal to the conveying direction of the conveyor belt and performing a detection operation for detecting densities of the density detecting test marks, based on the outputted detection signals.

The present invention further advantageously provides a method of controlling a color image forming apparatus that forms images of different colors and transfers the images of different colors to an image carrier while superimposing each of the images on one another. The method includes forming test marks of different colors on a conveyor belt of the image carrier in a conveying direction of the conveyor belt at predetermined intervals. The test marks include linear position displacement detecting test marks of different colors and density detecting test marks of different colors. Each of the linear position displacement detecting test marks extends diagonally by predetermined degrees relative to the conveying direction of the conveyor belt, and each of the density detecting test marks includes an area that has a predetermined density and is adjacent to each of the linear position displacement detecting test marks. The method further includes detecting the linear position displacement detecting test marks and the density detecting test marks and outputting detection signals, and performing a detection operation for detecting position displacements of the linear position displacement detecting test marks in a main-scanning direction of the conveyor belt which is perpendicular to the conveying direction of the conveyor belt and performing a detection operation for detecting densities of the density detecting test marks, based on the outputted detection signals.

The present invention further advantageously provides a method of controlling a color image forming apparatus that forms images of different colors and transfers the images of different colors to an image carrier while superimposing each of the images on one another. The method includes forming test marks of different colors on a conveyor belt of the image carrier in a conveying direction of the conveyor belt at predetermined intervals. The test marks include first linear position displacement detecting test marks of different colors, second linear position displacement detecting test marks of different colors, and density detecting test marks of different colors. Each of the first linear position displacement detecting test marks extends in a direction perpendicular to the conveying direction of the conveyor belt, each of the second linear position displacement detecting test marks extends diagonally by predetermined degrees relative to the conveying direction of the conveyor belt, and each of the density detecting test marks includes an area that has a predetermined density and is formed between each of the first linear position displacement detecting test marks and each of the second linear position displacement detecting test marks. The method further includes detecting the first linear position displacement detecting test marks, the second linear position displacement detecting test marks, and the density detecting test marks, and outputting detection signals. The method also includes performing a detection operation for detecting position displacements of the first linear position displacement detecting test marks in a sub-scanning direction of the conveyor belt which is equal to the conveying direction of the conveyor belt, performing a detection operation for detecting position displacements of the second linear position displacement detecting test marks in a main-scanning direction of the conveyor belt which is perpendicular to the conveying direction of the conveyor belt, and performing a detection operation for detecting densities of the density detecting test marks, based on the outputted detection signals.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein:

FIG. 14A is an enlarged view of one of test marks of the test mark group of FIG. 13A;

FIG. 14B is a diagram illustrating waveform of an output signal of the optical sensor;

FIG. 15A is a plan view of an exemplary test mark group according to another embodiment of the present invention;

FIG. 15B is a view showing a condition that a center portion of the test mark group of FIG. 15A in a direction perpendicular to a conveying direction of the test mark group passes the optical sensor;

DETAILED DESCRIPTION OF THE PREFERRED EMBODIMENTS

Figure 1:
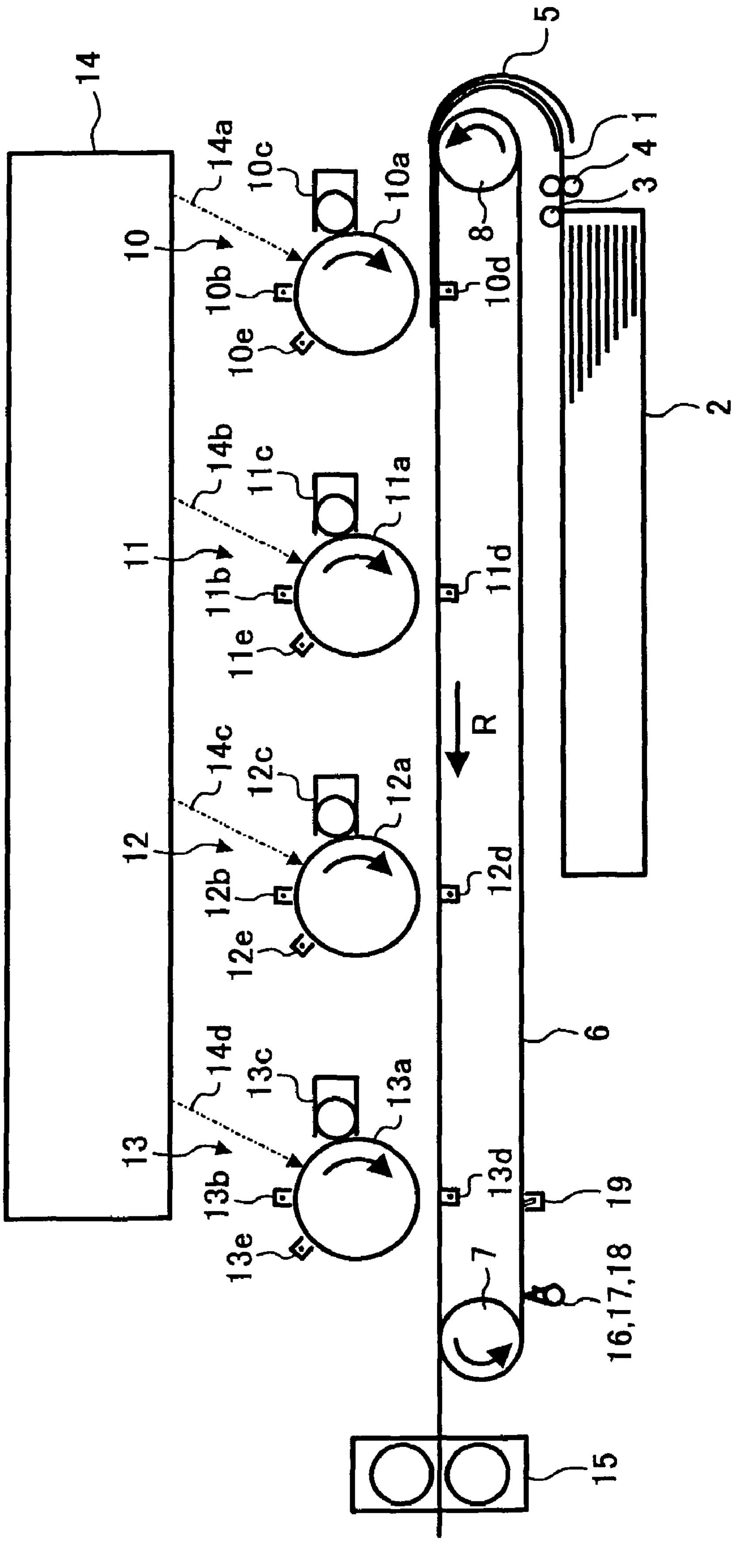
FIG. 1 is a view of an exemplary image forming system of a color image forming apparatus according to an embodiment of the present invention.

Preferred embodiments of the present invention are described with reference to the drawings, wherein like reference numerals designate identical or corresponding parts throughout the views.

FIG. 1 is a view of an exemplary image forming system of a color image forming apparatus according to an embodiment of the present invention. The color image forming apparatus of this embodiment includes so-called tandem type image forming units that form images of different colors, respectively. The images of different colors are sequentially transferred to a transfer sheet conveyed on a conveyor belt while being superimposed upon each other on the sheet.

With reference to FIG. 1, transfer sheets 1 are accommodated in a sheet feeding cassette 2. The uppermost transfer sheet 1 is picked up by a pick-up roller 3 and is fed out from the sheet feeding cassette 2 by a pair of sheet feeding rollers 4 toward a conveyor belt 6 through a guide member 5. The conveyor belt 6 is an endless belt that is spanned around a drive roller 7 and a driven roller 8, and is driven to rotate in a direction indicated by arrow R by the rotation of the drive roller 7.

A magenta image forming unit 10, a cyan image forming unit 11, a yellow image forming unit 12, and a black image forming unit 13 are disposed above and along the conveyor belt 6 in the order from the upstream side of the conveying direction of the conveyor belt 6. The conveyor belt 6 conveys the transfer sheet 1 fed from the sheet feeding cassette 2 by the sheet feeding rollers 4.

In the magenta image forming unit 10, a surface of a photosensitive drum 10_a_ is charged by a charger 10_b_ and is exposed to magenta image light 14_a_ emitted from an optical writing unit 14. As a result, an electrostatic latent image corresponding to a magenta image is formed on the photosensitive drum 10*a*. The electrostatic latent image is developed with a magenta toner by a developing unit 10*c*. Thus, a magenta toner image is formed on the photosensitive drum 10*a*. Subsequently, the magenta toner image is transferred to the transfer sheet 1 by a transfer unit 10*d* at a position where the transfer sheet 1 on the conveyor belt 6 is brought into contact with the photosensitive drum 10*a*, so that a magenta toner image is formed on the transfer sheet 1. After transferring the magenta toner image to the transfer sheet 1, the residual toner remaining on the surface of the photosensitive drum 10*a* is removed by a cleaning unit 10*e*. The surface of the photosensitive drum 10*a* is uniformly discharged to be prepared for a next image forming operation.

The transfer sheet 1 having the magenta toner image transferred thereto is next conveyed to the cyan image forming unit 11 by the conveyor belt 6. In the cyan image forming unit 11, a cyan toner image is formed on a photosensitive drum 11*a* similarly as in the magenta image forming unit 10 by using a charger 11*b*, cyan image light 14*b* emitted from the optical writing unit 14, and a developing unit 11*c*. Subsequently, the cyan toner image is transferred to the transfer sheet 1 by a transfer unit 11*d* while being superimposed on the magenta toner image. After transferring the cyan toner image to the transfer sheet 1, the residual toner remaining on the surface of the photosensitive drum 11*a* is removed by a cleaning unit 11*e*. The surface of the photosensitive drum 11*a* is uniformly discharged to be prepared for a next image forming operation.

The transfer sheet 1 is further conveyed to the yellow image forming unit 12 by the conveyor belt 6. In the yellow image forming unit 12, a yellow toner image is formed on a photosensitive drum 12*a* similarly as in the magenta image forming unit 10 and the cyan image forming unit 11 by using a charger 12*b*, yellow image light 14*c* emitted from the optical writing unit 14, and a developing unit 12*c*. Subsequently, the yellow toner image is transferred to the transfer sheet 1 by a transfer unit 12*d* while being superimposed on the superimposed magenta and cyan toner image. After transferring the yellow toner image to the transfer sheet 1, the residual toner remaining on the surface of the photosensitive drum 12*a* is removed by a cleaning unit 12*e*. The surface of the photosensitive drum 12*a* is uniformly discharged to be prepared for a next image forming operation.

The transfer sheet 1 is further conveyed to the black image forming unit 13 by the conveyor belt 6. In the black image forming unit 13, a black toner image is formed on a photosensitive drum 13*a* similarly as in the above-described image forming units 10, 11, and 12 by using a charger 13*b*, black image light 14*d* emitted from the optical writing unit 14, and a developing unit 13*c*. Subsequently, the black toner image is transferred to the transfer sheet 1 by a transfer unit 13*d* while being superimposed on the superimposed magenta, cyan, and yellow toner image. Thus, a full-color image is formed on the transfer sheet 1. After transferring the black toner image to the transfer sheet 1, the residual toner remaining on the surface of the photosensitive drum 13*a* is removed by a cleaning unit 13*e*. The surface of the photosensitive drum 13*a* is uniformly discharged to be prepared for a next image forming operation.

The transfer sheet 1 now having the full-color image formed thereon is separated from the conveyor belt 6 and conveyed to a fixing unit 15 in which the full-color image is fixed onto the transfer sheet 1 by heat and pressure.

Figure 2:
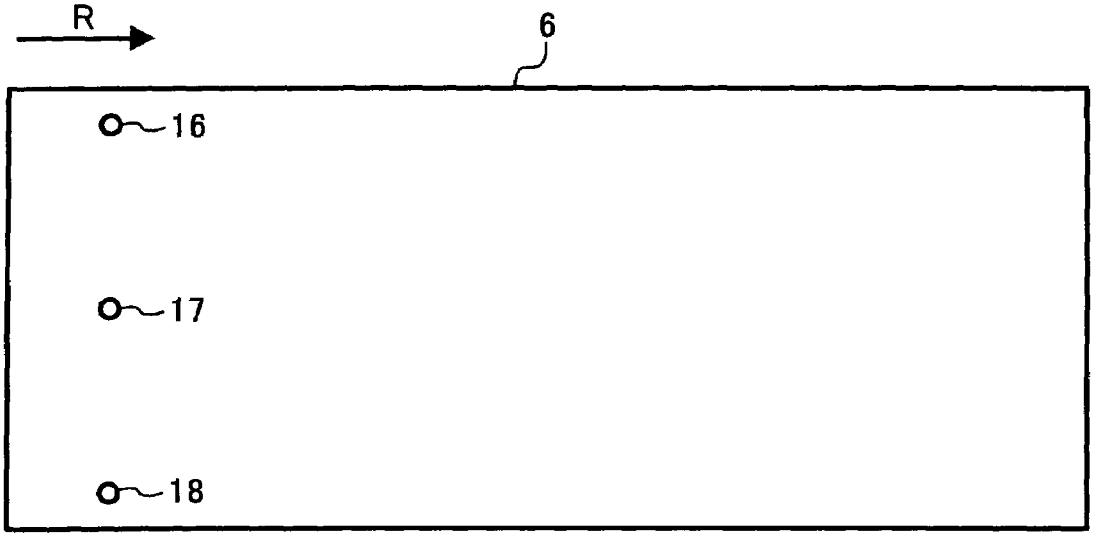
FIG. 2 is a plan view of a conveyor belt and three optical sensors seen from below.

As illustrated in FIGS. 1 and 2, reflection type optical sensors 16, 17, and 18 are provided below the conveyor belt 6 in the direction perpendicular to a conveying direction indicated by arrow "R" of the conveyor belt 6 at predetermined intervals. FIG. 2 is a plan view of the conveyor belt 6 and the optical sensors 16, 17, and 18 seen from below. The optical sensor 17 is disposed at the center of the conveyor belt 6 in its width direction. The optical sensors 16 and 18 are disposed at positions adjacent to end portions of the conveyor belt 6 in its width direction, respectively. Further, a cleaning unit 19 is provided below the conveyor belt 6 in the vicinity of the optical sensors 16, 17, and 18 to remove test marks (described below) formed on the conveyor belt 6.

In this embodiment, a position displacement of each of color toner images is automatically detected every time 50 to 100 prints are output, for example, and a color image forming position is adjusted based on the position displacement detection result. In addition, a density of each of color toner images is automatically detected every time 10 to 30 prints are output, for example, and a density of a color toner image is adjusted based on the density detection result. Position displacement adjustment operation and density adjustment operation can be performed at desired timing in accordance with user's instruction. In the color image forming apparatus of the present embodiment, both the position displacement detection and adjustment operations and the density detection and adjustment operations are performed in an initial setting operation performed when a power supply of the color image forming apparatus is turned on.

Figure 3:
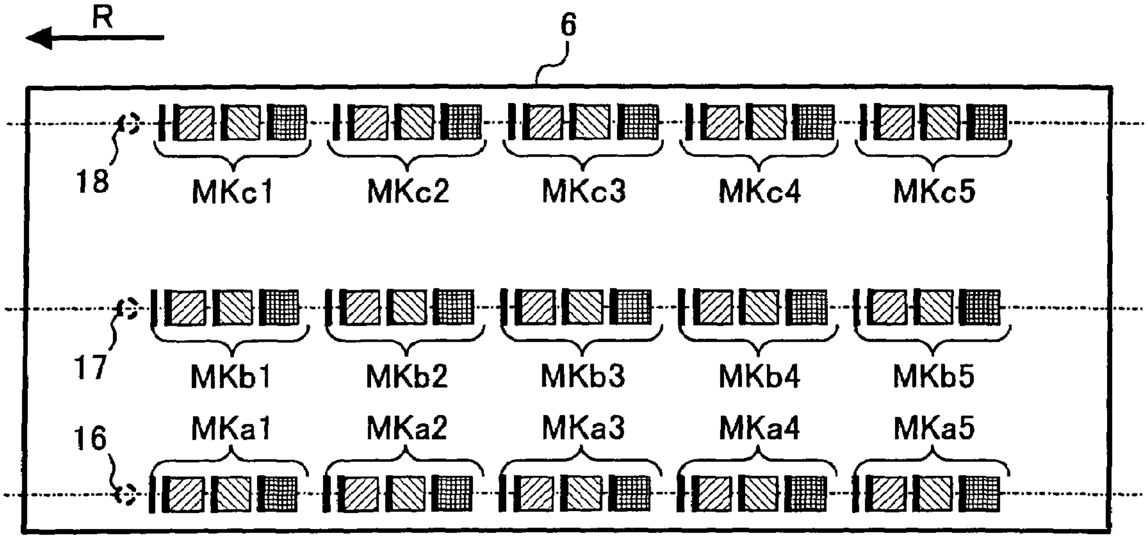
FIG. 3 is a plan view of exemplary test mark groups formed on the conveyor belt seen from above according to the embodiment of the present invention.

The same test toner marks are used in common in both the position displacement detection and adjustment operations and the density detection and adjustment operations. FIG. 3 illustrates exemplary test marks. Five groups of test marks are formed along a line extending in the conveying direction of the conveyor belt 6 at positions where each of the optical sensors 16, 17, and 18 can detect the five groups of test marks. Specifically, five groups of test marks "MKa1", "MKa2", "MKa3", "MKa4", and "MKa5" (hereafter may be referred to as "test marks to be detected by the optical sensor 16") are formed in a line to be detected by the optical sensor 16. Further, five groups of test marks "MKb1", "MKb2", "MKb3", "MKb4", and "MKb5" (hereafter may be referred to as "test marks to be detected by the optical sensor 17") are formed in a line to be detected by the optical sensor 17. Moreover, five groups of test marks "MKc1", "MKc2", "MKc3", "MKc4", and "MKc5" (hereafter may be referred to as "test marks to be detected by the optical sensor 18") are formed in a line to be detected by the optical sensor 18. As illustrated in FIG. 3, the test marks to be detected by the optical sensor 16, the test marks to be detected by the optical sensor 17, and the test marks to be detected by the optical sensor 18 are formed in parallel with each other.

Each of the test mark groups "MKa1", "MKa2", "MKa3", "MKa4", and "MKa5" to be detected by the optical sensor 16 includes linear edge elements that extend in the direction perpendicular to the conveying direction of the conveyor belt 6 and that are used for detecting position displacements of test marks in the sub-scanning direction, that is, the conveying direction of the conveyor belt 6. Each of the test mark groups "MKa1", "MKa2", "MKa3", "MKa4", and "MKa5" to be detected by the optical sensor 16 further includes plane elements used for detecting respective densities of yellow, cyan, and magenta test marks. The densities of the plane elements are different from each other among the test mark groups "MKa1", "MKa2", "MKa3", "MKa4", and "MKa5". For example, the density of each of the plane elements of the test mark group "MKa1" is set to 10%, the density of each of the plane elements of the test mark group. "MKa2" is set to 30%, the density of each of the plane elements of the test mark group "MKa3" is set to 50%, the density of each of the plane elements of the test mark group "MKa4" is set to 70%, and the density of each of the plane elements of the test mark group "MKa5" is set to 100%.

The test mark groups "MKb1", "MKb2", "MKb3", "MKb4", and "MKb5" to be detected by the optical sensor 17 and the test mark groups "MKc1", "MKc2", "MKc3", "MKc4", and "MKc5" to be detected by the optical sensor 18 have substantially the same configurations as those of the test mark groups "MKa1", "MKa2", "MKa3", "MKa4", and "MKa5" to be detected by the optical sensor 16.

Figures 4A, 4B:
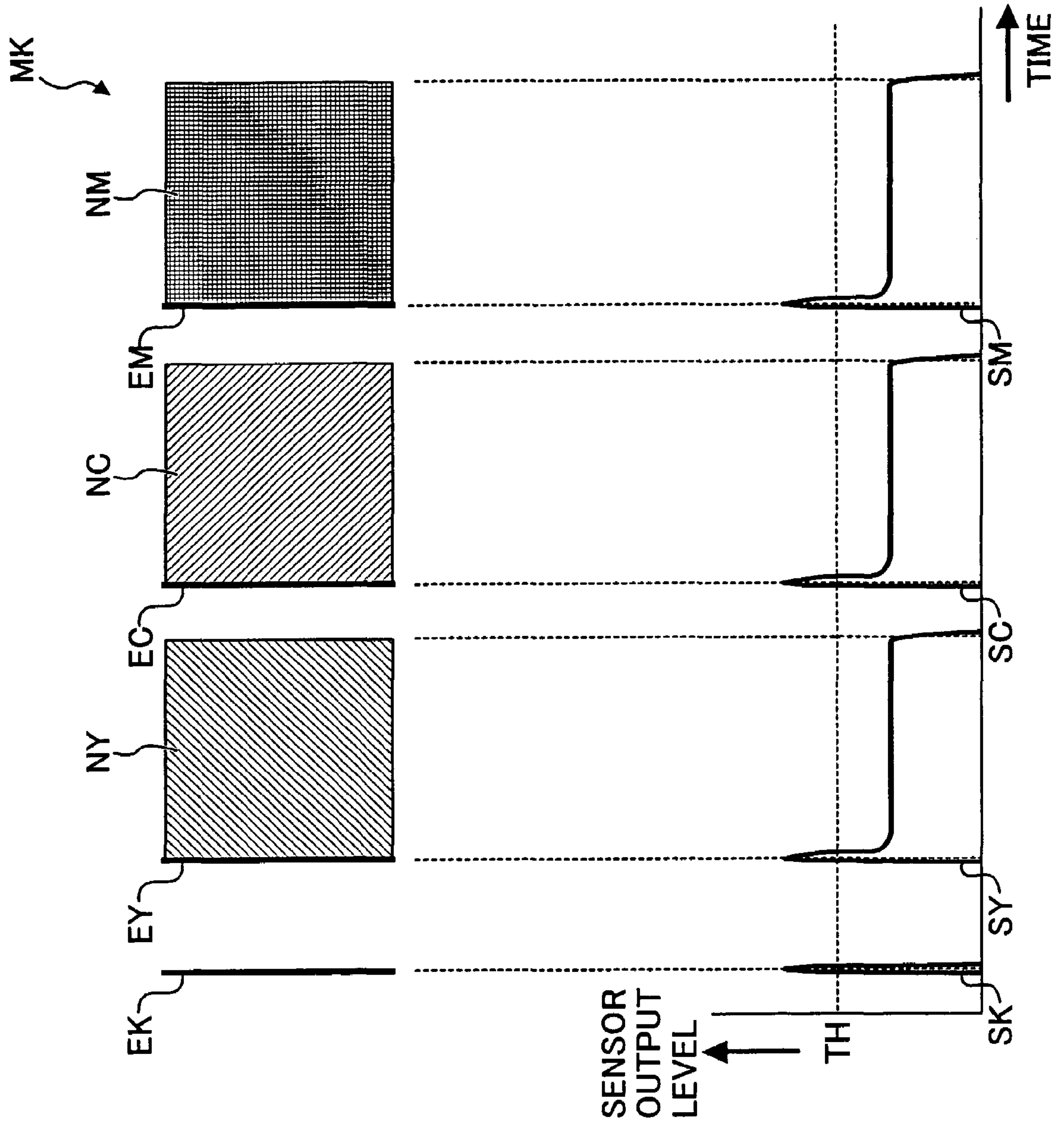
FIG. 4A is an enlarged view of one of the test mark groups of FIG. 3.
FIG. 4B is a diagram illustrating waveform of an output signal of the optical sensor.

FIG. 4A is an enlarged view of the of the test mark groups "MKa1", "MKa2", "MKa3", "MKa4", and "MKa5", which is simply referred to as a test mark group "MK". The test mark group "MK" includes a linear black mark "EK" that forms a linear edge element extending in the direction perpendicular to the conveying direction of the conveyor belt 6 and that acts a reference mark used for detecting position displacements of test marks in the sub-scanning direction. The test mark group "MK" further includes a yellow mark "EY" that forms a linear edge element in parallel with the black mark "EK" at a predetermined distance apart and that has the same size as that of the black mark "EK", and includes a yellow solid mark "NY" of a square shape having the yellow mark "EY" as one side of the square shape. The test mark group "MK" further includes a cyan mark "EC" that forms a linear edge element in parallel with the black mark "EK" and is located at a predetermined distance apart from a trailing edge portion of the yellow solid mark "NY". The size of the cyan mark "EC" is the same as that of the black mark "EK". The test mark group "MK" further includes a cyan solid mark "NC" of a square shape having the cyan mark "EC" as one side of the square shape. The test mark group "MK" further includes a magenta mark "EM" that forms a linear edge element formed in parallel with the black mark "EK" and is located at a predetermined distance apart from a trailing edge portion of the cyan solid mark "NC". The size of the magenta mark "EM" is the same as that of the black mark "EK". The test mark group "MK" further includes a magenta solid mark "NM" of a square shape having the magenta mark "EM" as one side of the square shape. The density of the each of the yellow solid mark "NY", the cyan solid mark "NC", and the magenta solid mark "NM" is set to a predetermined value set for the test mark group "MK".

When one of the optical sensors 16, 17, and 18 (for example, the optical sensor 16) reads the above-described marks "EK", "EY", "NY", "EC", "NC", "EM", and "NM", an output level of the optical sensor 16 varies as illustrated in FIG. 4B.

Specifically, when the optical sensor 16 detects the black mark "EK", the level of the output signal of the optical sensor 16 becomes a peak value (waveform SK) corresponding to the density of the black mark "EK". Likewise, when the optical sensor 16 detects the yellow mark "EY", the level of the output signal of the optical sensor 16 becomes a peak value corresponding to the density of the yellow mark "EY". Following the detection of the yellow mark "EY", the optical sensor 16 detects the yellow solid mark "NY", and the level of the output signal of the optical sensor 16 becomes flat corresponding to the density of the yellow solid mark "NY" (waveform SY). Subsequently, when the optical sensor 16 detects the cyan mark "EC", the level of the output signal of the optical sensor 16 becomes a peak value corresponding to the density of the cyan mark "EC". Following the detection of the cyan mark "EC", the optical sensor 16 detects the cyan solid mark "NC", and the level of the output signal of the optical sensor 16 becomes flat corresponding to the density of the cyan solid mark "NC" (waveform SC). Then, when the optical sensor 16 detects the magenta mark "EM", the level of the output signal of the optical sensor 16 becomes a peak value corresponding to the density of the magenta mark "EM". Following the detection of the magenta mark "EM", the optical sensor 16 detects the magenta solid mark "NM", and the level of the output signal of the optical sensor 16 becomes flat corresponding to the density of the magenta solid mark "NM" (waveform SM).

By providing a predetermined threshold value "TH" to the level of the output signal of the optical sensor 16, a period in which the level of its output signal exceeds the threshold value "TH" is extracted. Then, a center point in the extracted period is determined to represent a detection timing of the mark forming the linear edge element.

Figure 5:
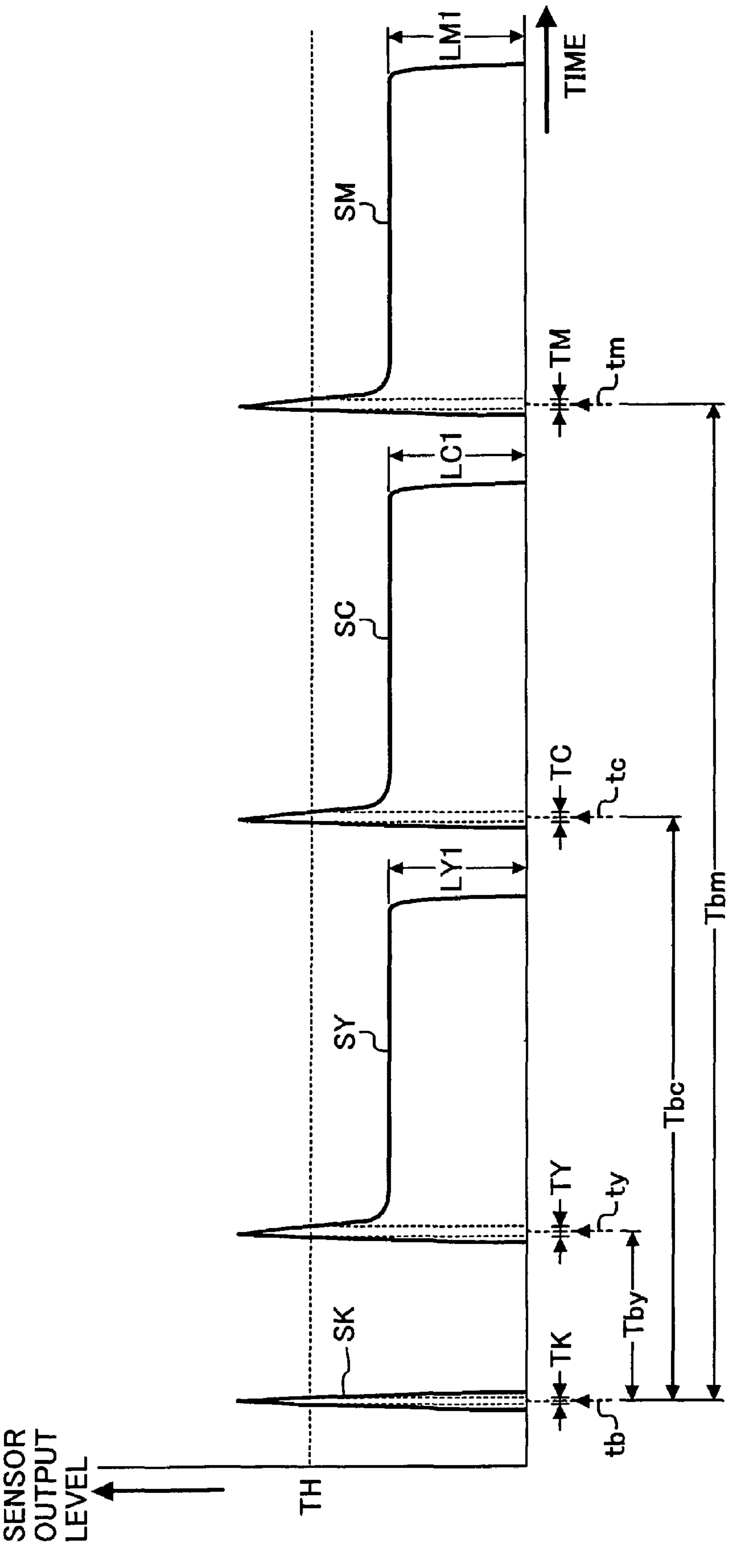
FIG. 5 is an enlarged diagram illustrating the waveform of FIG. 4B.

For example, as illustrated in FIG. 5, when the waveform SK of the output signal of the optical sensor 16 is analyzed based on the threshold value "TH", the center point (time) "tb" in a period "TK" in which the level of the output signal of the optical sensor 16 exceeds the threshold value "TH" is determined to represent a detection timing of the black mark "EK". The detection timing of the black mark "EK" is defined as a reference position (time) used for detecting position displacements of the test marks in the sub-scanning direction.

Further, when the waveform SY of the output signal of the optical sensor 16 is analyzed based on the threshold value "TH", the center point (time) "ty" in a period "TY" in which the level of the output signal of the optical sensor 16 exceeds the threshold value "TH" is determined to represent a detection timing of the yellow mark "EY" forming the linear edge element. The time period "Tby" between the time "tb" and the time "ty" indicates a position displacement detection value which is used to determine the position displacement of the yellow mark "EY" in the sub-scanning direction. In addition, a level "LY1" of the flat portion of the waveform "SY" of the output signal of the optical sensor 16 is used as a detection value of the density of the yellow solid mark "NY".

Further, when the waveform SC of the output signal of the optical sensor 16 is analyzed based on the threshold value "TH", the center point (time) "tc" in a period "TC" in which the level of the output signal of the optical sensor 16 exceeds the threshold value "TH" is determined to represent a detection timing of the cyan mark "EC" forming the linear edge element. The time period "Tbc" between the time "tb" and the time "tc" indicates a position displacement detection value which is used to determine the position displacement of the cyan mark "EC" in the sub-scanning direction. In addition, a level "LC1" of the flat portion of the waveform "SC" of the output signal of the optical sensor 16 is used as a detection value of the density of the cyan solid mark "NC".

Moreover, when the waveform SM of the output signal of the optical sensor 16 is analyzed based on the threshold value "TH", the center point (time) "tm" in a period "TM" in which the level of the output signal of the optical sensor 16 exceeds the threshold value "TH" is determined to represent a detection timing of the magenta mark "EM" forming the linear edge element. The time period "Tbm" between the time "tb" and the time "tm" indicates a position displacement detection value which is used to determine the position displacement of the magenta mark "EM" in the sub-scanning direction. In addition, a level "LM1" of the flat portion of the waveform "SM" of the output signal of the optical sensor 16 is used as a detection value of the density of the magenta solid mark "NM".

As described above, the five groups of test marks are formed along lines extending in the conveying direction of the conveyor belt 6, respectively, at positions where each of the optical sensors 16, 17, and 18 can detect the five groups of test marks. That is, fifteen groups of test marks in total are formed on the conveyor belt 6. Therefore, respective five position displacement detection values of the yellow mark, the cyan mark, and the magenta mark in the sub-scanning direction can be obtained from the five groups of test marks (e.g., the test mark groups "MKa1", "MKa2", "MKa3", "MKa4", and "MKa5") formed in the conveying direction of the conveyor belt 6. The position displacement detection value in the sub-scanning direction of each of the yellow mark, the cyan mark, and the magenta mark used in position displacement detection and adjustment operations is obtained by averaging the above-described respective five position displacement detection values of the yellow mark, the cyan mark, and the magenta mark in the sub-scanning direction. By using these average values, the accuracy of the position displacement detection value in the sub-scanning direction of each of the yellow mark, the cyan mark, and the magenta mark used in position displacement detection and adjustment operations can be increased.

An adequate value is preset relative to the position displacement detection value in the sub-scanning direction of each of the yellow mark, the cyan mark, and the magenta mark. The difference between the position displacement detection value and the adequate value is obtained as a position displacement amount. If the position displacement detection value is greater than the adequate value, image formation timing of the apparatus is advanced. If the position displacement detection value is less than the adequate value, image formation timing of the apparatus is delayed. By performing this position displacement adjustment operation in the sub-scanning direction, image formation timing for each of a yellow image, a cyan image, and a magenta image in the sub-scanning direction can be corrected to proper image formation timing. Because such a position displacement adjustment operation in the sub-scanning direction is known technology, its detail description is omitted here.

Figure 6:
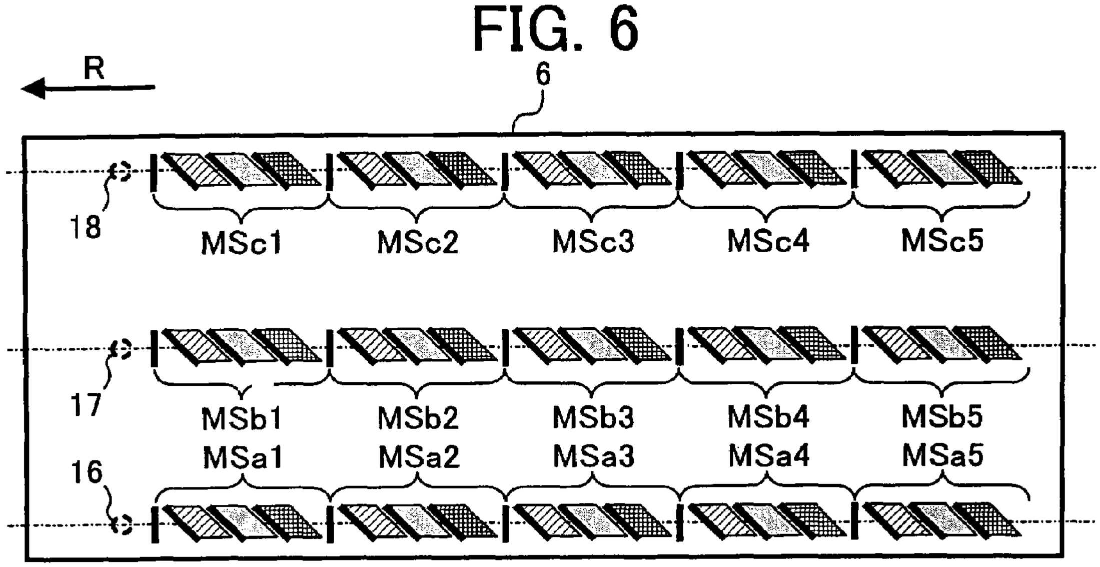
FIG. 6 is a plan view of exemplary test mark groups formed on the conveyor belt seen from above according to another embodiment of the present invention.

In the above-described embodiment, the position displacement detection in the sub-scanning direction of the conveyor belt 6 is described. When performing the position displacement detection in the main-scanning direction of the conveyor belt 6, different type of test marks are used. FIG. 6 illustrates exemplary test marks. Five groups of test marks are formed along a line extending in the conveying direction of the conveyor belt 6 at positions where each of the optical sensors 16, 17, and 18 can detect the five groups of test marks. Specifically, five groups of test marks "MSa1", "MSa2", "MSa3", "MSa4", and "MSa5" (hereafter may be referred to as "test marks to be detected by the optical sensor 16") are formed in a line to be detected by the optical sensor 16. Further, five groups of test marks "MSb1", "MSb2", "MSb3", "MSb4", and "MSb5" (hereafter may be referred to as "test marks to be detected by the optical sensor 17") are formed in a line to be detected by the optical sensor 17. Moreover, five groups of test marks "MSc1", "MSc2", "MSc3", "MSc4", and "MSc5" (hereafter may be referred to as "test marks to be detected by the optical sensor 18") are formed in a line to be detected by the optical sensor 18. As illustrated in FIG. 6, the test marks to be detected by the optical sensor 16, the test marks to be detected by the optical sensor 17, and the test marks to be detected by the optical sensor 18 are formed in parallel with each other.

Each of the test mark groups "MSa1", "MSa2", "MSa3", "MSa4", and "MSa5" to be detected by the optical sensor 16 includes linear edge elements that extend in the direction perpendicular to the conveying direction of the conveyor belt 6 and that are used for detecting position displacements of test marks in the sub-scanning direction. Each of the test mark groups "MSa1", "MSa2", "MSa3", "MSa4", and "MSa5" to be detected by the optical sensor 16 further includes plane elements used for detecting respective densities of yellow, cyan, and magenta test marks. The densities of the plane elements are different from each other among the test mark groups "MSa1", "MSa2", "MSa3", "MSa4", and "MSa5". For example, the density of each of the plane elements of the test mark group "MSa1" is set to 10%, the density of each of the plane elements of the test mark group "MSa2" is set to 30%, the density of each of the plane elements of the test mark group "MSa3" is set to 50%, the density of each of the plane elements of the test mark group "MSa4" is set to 70%, and the density of each of the plane elements of the test mark group "MSa5 " is set to 100%.

The test mark groups "MSb1", "MSb2", "MSb3", "MSb4", and "MSb5" to be detected by the optical sensor 17 and the test mark groups "MSc1", "MSc2", "MSc3", "MSc4", and "MSc5" to be detected by the optical sensor 18 have substantially the same configurations as those of the test mark groups "MSa1", "MSa2", "MSa3", "MSa4", and "MSa5" to be detected by the optical sensor 16.

Figure 7A:
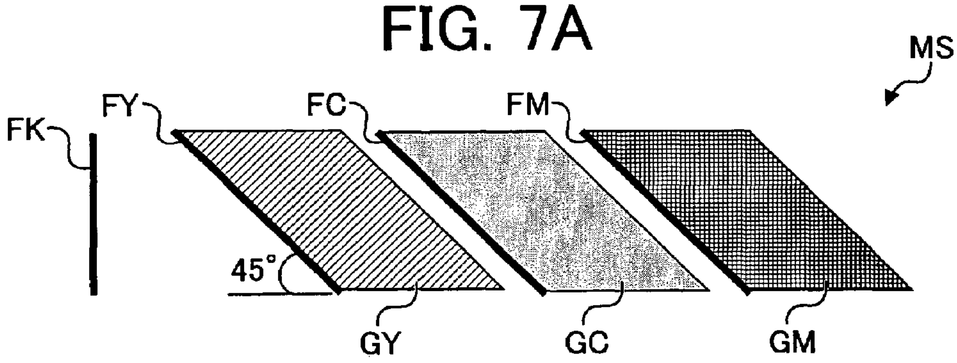
FIG. 7A is an enlarged view of one of the test mark groups of FIG. 6.

FIG. 7A is an enlarged view of one of the test mark groups "MSa1", "MSa2", "MSa3", "MSa4", and "MSa5", which is simply referred to as a test mark group "MS". The test mark group "MS" includes a linear black mark "FK" that forms a linear edge element extending in the direction perpendicular to the conveying direction of the conveyor belt 6 and that acts a reference mark used for detecting position displacements of test marks in the main-scanning direction. The test mark group "MS" further includes a diagonal linear yellow mark "FY" that extends diagonally, for example, by about forty-five degrees relative to the conveying direction of the conveyor belt 6. The test mark group "MS" further includes a yellow solid mark "GY" of a parallelogram shape having the yellow mark "FY" as one side of the parallelogram shape and having another side extending in parallel with the conveying direction of the conveyor belt 6.

The test mark group "MS" further includes a diagonal linear cyan mark "FC" that forms a linear edge element in parallel with the yellow mark "FY" and is located at a predetermined distance apart from a trailing edge portion of the yellow solid mark "GY". The size of the cyan mark "FC" is the same as that of the yellow mark "FY". The test mark group "MS" further includes a cyan solid mark "GC" of a parallelogram shape having the cyan mark "FC" as one side of the parallelogram shape and having another side extending in parallel with the conveying direction of the conveyor belt 6. The test mark group "MS" further includes a diagonal linear magenta mark "FM" that forms a linear edge element in parallel with the yellow mark "FY" and is located at a predetermined distance apart from a trailing edge portion of the cyan solid mark "GC". The size of the magenta mark "FM" is the same as that of the yellow mark "FY". The test mark group "MS" further includes a magenta solid mark "GM" of a parallelogram shape having the magenta mark "FM" as one side of the parallelogram shape and having another side extending in parallel with the conveying direction of the conveyor belt 6. The density of the each of the yellow solid mark "GY", the cyan solid mark "GC", and the magenta solid mark "GM" is set to a predetermined value set for the test mark group "MS".

Figure 7B:
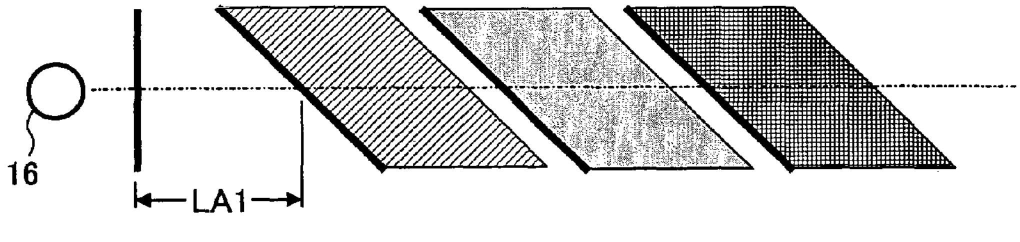
FIG. 7B is a view showing a condition that a center portion of the test mark group of FIG. 7A in a direction perpendicular to a conveying direction of the test mark group passes the optical sensor.
Figure 7C:
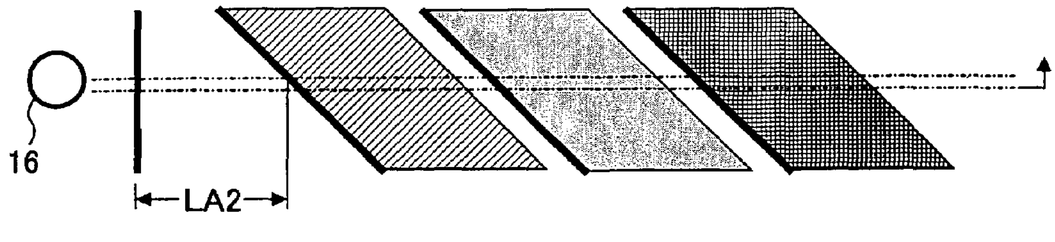
FIG. 7C is a view showing a condition that the test mark group, which is displaced downward relative to the position of the test mark group of FIG. 7B, passes the optical sensor.

FIG. 7B is a view showing a condition that the center portion of the test mark group "MS" in the direction perpendicular to the conveying direction of the test mark group "MS" passes the optical sensor 16. FIG. 7C is a view showing a condition that the test mark group "MS", which is displaced downward relative to the position of the test mark group "MS" of FIG. 7B, passes the optical sensor 16. As illustrated in FIGS. 7B and 7C, a distance from when the black mark "FK" passes the optical sensor 16 to when the yellow mark "FY" passes the optical sensor 16 is indicated by a reference character "LA1" in FIG. 7B and by a reference character "LA2" in FIG. 7C. The distance "LA2" is less than the distance "LA1". Thus, the position displacement of the test mark group "MS" in the main-scanning direction of the conveyor belt 6 can be detected by measuring a time period from when the black mark "FK" passes the optical sensor 16 to when the yellow mark "FY", the cyan mark "FC", or the magenta mark "FM" passes the optical sensor 16. The detection timing of each of the black mark "FK", the yellow mark "FY", the cyan mark "FC", and the magenta mark "FM" is determined in a similar manner as the detection timing of each of the black mark "EK", the yellow mark "EY", the cyan mark "EC", and the magenta mark "EM" which is described with reference to FIG. 5.

Image formation timing for each of a yellow image, a cyan image, and a magenta image in the main-scanning direction can be corrected to proper image formation timing based on a position displacement detection value in the main-scanning direction of each of the yellow mark, the cyan mark, and the magenta mark as similarly in the above-described position displacement adjustment operation in the sub-scanning direction. Because a position displacement adjustment operation in the main-scanning direction is known technology, its detail description is omitted here.

Figure 8:
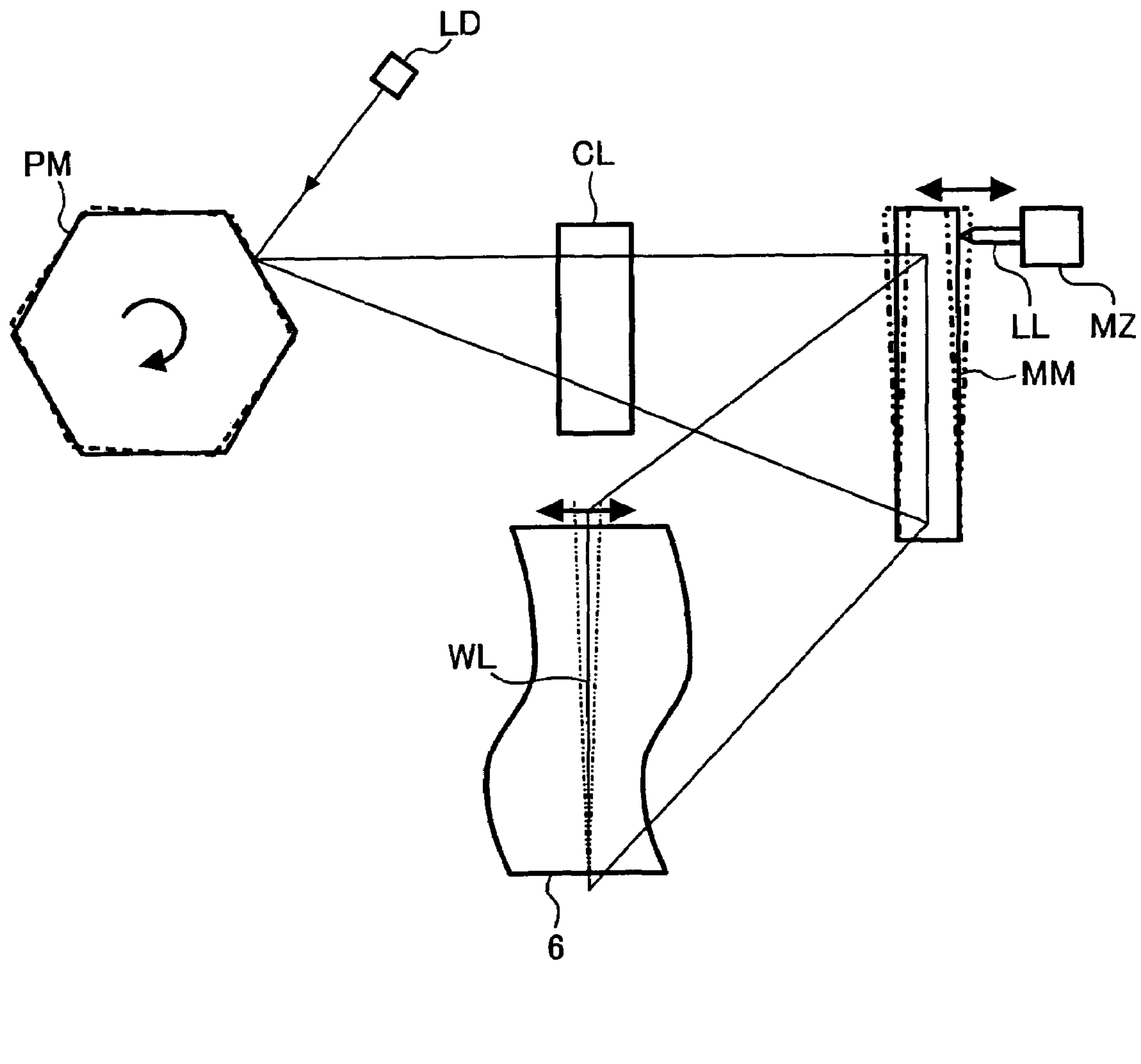
FIG. 8 is a diagram showing a mechanism used for correcting a position displacement of toner image due to skew of the conveyor belt.

By the above-described position displacement detections of test marks in the main-scanning direction and the sub-scanning direction of the conveyor belt 6, a skew condition of the conveyor belt 6 can be detected. The position displacement of toner image due to the skew of the conveyor belt 6 can be corrected by using a mechanism illustrated in FIG. 8 which is included in the optical writing unit 14.

An optically modulated laser beam, which is emitted from a laser diode "LD" in accordance with image data, is reflected by a polygon mirror "PM". The laser beam reflected by the polygon mirror "PM" passes through a cylindrical lens "CL" and is reflected by a mirror "MM". The laser beam reflected by the mirror "MM" is emitted toward an image writing line "WL" on the conveyor belt 6 as image light.

A part "LL" attached to a shaft of a skew correction motor "MZ" contacts the side surface of the mirror "MM". The inclination of the mirror "MM" changes by moving the part "LL" by rotating the shaft of the skew correction motor "MZ". By changing the inclination of the mirror "MM", an angle of laser beam emitted to the image writing line "WL" on the conveyor belt 6 changes. As a result, the position displacement of toner image due to the skew of the conveyor belt 6 can be corrected.

In the present embodiment, the position displacement in the sub-scanning direction and the position displacement in the main-scanning direction are performed at three positions in the widthwise direction (i.e., the main-scanning direction) of the conveyor belt 6. By this arrangement, an operation for correcting an image scaling ratio in the sub-scanning direction and the main-scanning direction can be performed. Because such an operation for correcting an image scaling ratio is a known technique, its descriptions are omitted.

Figure 9:
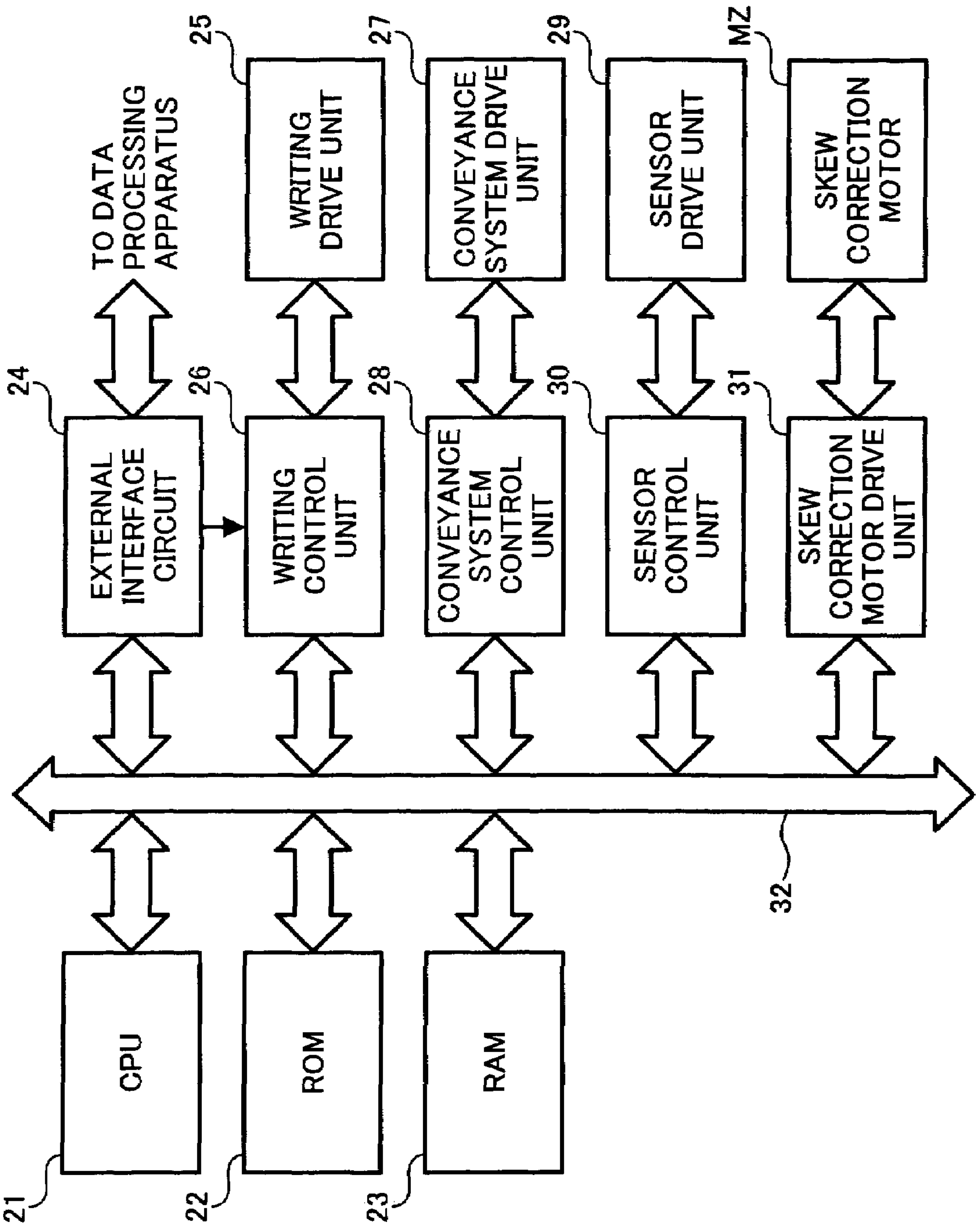
FIG. 9 is a block diagram of a control system of the color image forming apparatus according to the embodiment of the present invention.

FIG. 9 is a block diagram of a control system of the color image forming apparatus according to the embodiment of the present invention. The control system includes a central processing unit (CPU) 21, a read-only memory (ROM) 22, and a random-access memory (RAM) 23. The CPU 21 controls an operation of each of the units of the color image forming apparatus. The ROM 22 stores programs executed by the CPU 21. The RAM 23 forms a work area for the CPU 21.

The control system further includes an external interface circuit 24, a writing drive unit 25, a writing control unit 26, a conveyance system drive unit 27, a conveyance system control unit 28, a sensor drive unit 29, a sensor control unit 30, and a skew correction motor drive unit 31. The external interface circuit 24 is connected to a data processing apparatus such as, a personal computer, which uses the color image forming apparatus as a printer. The writing drive unit 25 drives the optical writing unit 14. The writing control unit 26 receives recording data input through the external interface circuit 24, and controls the writing drive unit 25 to drive the optical writing unit 14 for performing image writing operations.

The conveyance system drive unit 27 drives a conveyance system, such as a conveyance system for conveying the transfer sheet 1, and a conveyance system for conveying the conveyor belt 6. The conveyance system control unit 28 controls the operation of the conveyance system drive unit 27. The sensor drive unit 29 drives the optical sensors 16, 17, and 18. The sensor control unit 30 controls operations of the optical sensors 16, 17, and 18. The skew correction motor drive unit 31 drives the skew correction motor "MZ".

The CPU 21, the ROM 22, the RAM 23, the external interface circuit 24, the writing control unit 26, the conveyance system control unit 28, the sensor control unit 30, and the skew correction motor drive unit 31 are connected to an internal bus 32. Transmission and reception of data among these elements are achieved through the internal bus 32.

Figure 10:
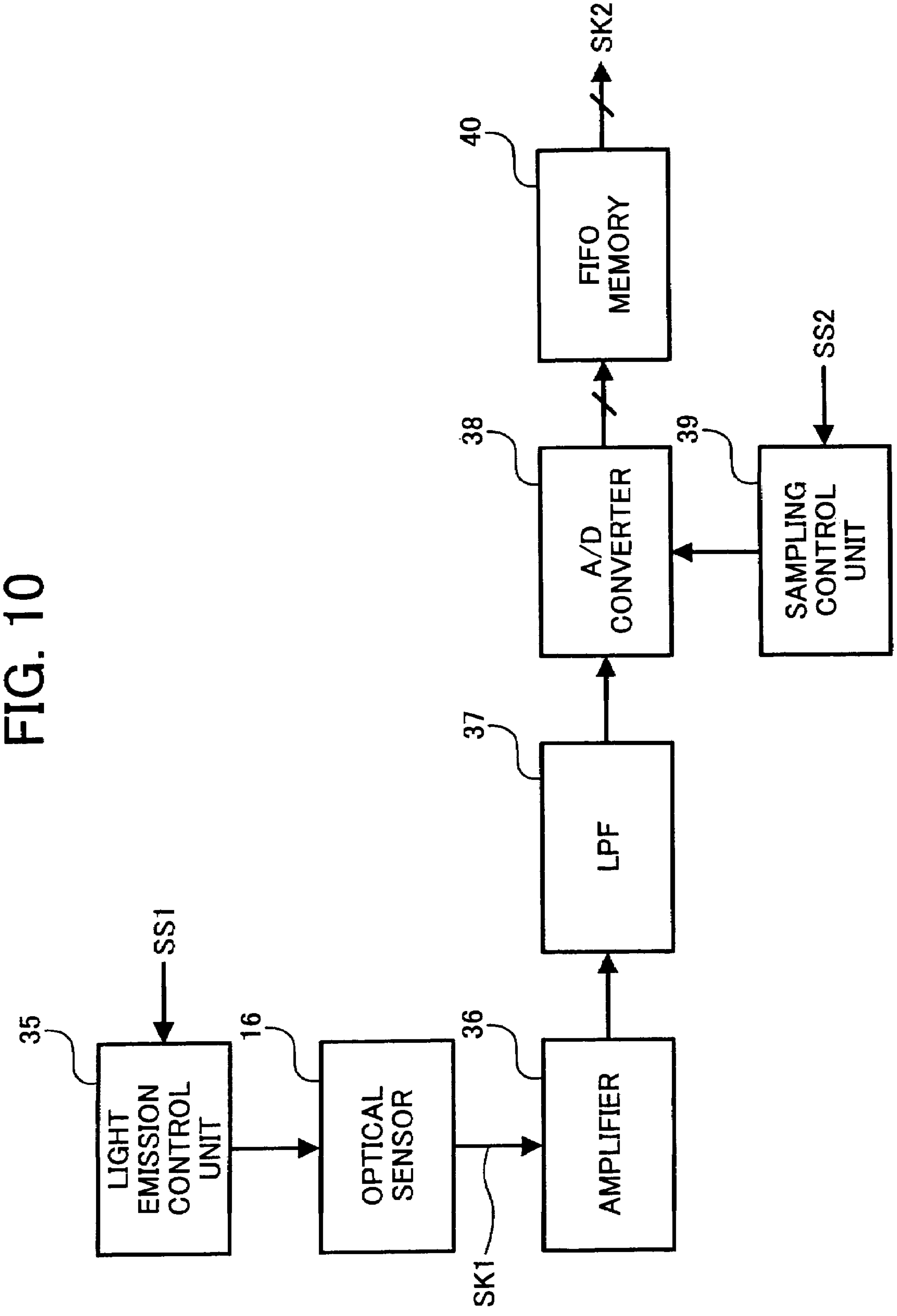
FIG. 10 is a block diagram of a sensor drive unit and a sensor control unit according to the embodiment of the present invention.

FIG. 10 is a block diagram of the sensor drive unit 29 and the sensor control unit 30. Specifically, FIG. 10 shows a part of the exemplary configuration relating to the optical sensor 16. The configurations relating to the optical sensors 17 and 18 can be achieved similarly as the configuration relating to the optical sensor 16.

With reference to FIG. 10, a light emission control unit 35 controls a light emission of the optical sensor 16 in accordance with a control signal SS1 output from the CPU 21. After a detection signal SK1 of the optical sensor 16 is amplified by an amplifier 36, high frequency noise components are removed from the amplified detection signal SKI by a low-pass filter (LPF) 37. Then, the detection signal SK1 is input to an analog/digital (A/D) converter 38.

The A/ID converter 38 samples the detection signal SK1 input to the A/D converter 38 at a predetermined timing instructed by a sampling control unit 39, and converts the sampled detection signal SK1 to a digital signal. The digital signal is output to the CPU 21 as a digital detection signal SK2 through an FIFO (first-in and first-out) memory 40. In FIG. 10, a reference character SS2 indicates a control signal output from the CPU 21 to the sampling control unit 39.

Figure 11:
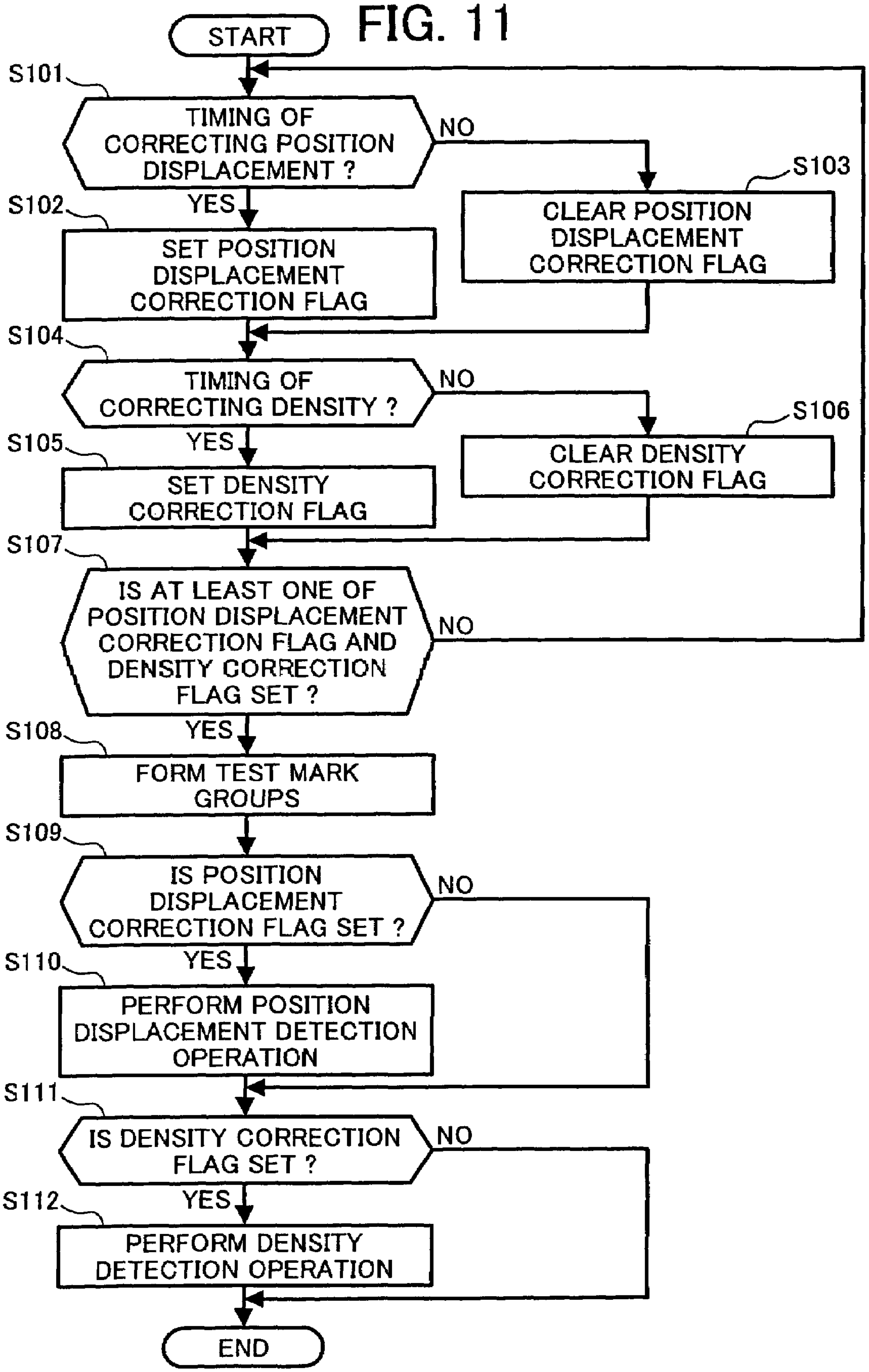
FIG. 11 is a flowchart of position displacement detection process operation steps and density detection process operation steps of a CPU according to an embodiment of the present invention.

FIG. 11 is a flowchart of position displacement detection process operation steps and density detection process operation steps of a CPU according to an embodiment of the present invention.

In step S101 of FIG. 11, the CPU 21 determines if it is the timing of correcting position displacement. If the answer is YES in step S101, the CPU 21 sets a position displacement correction flag in step S102. If the answer is NO in step S101, the CPU 21 clears the position displacement correction flag in step S103.

Subsequently, the CPU 21 determines if it is the timing of correcting density in step S104. If the answer is YES in step S104, the CPU 21 sets a density correction flag in step S105. If the answer is NO in step S104, the CPU 21 clears the density correction flag in step S106.

Then, the CPU 21 determines if at least one of the position displacement correction flag and the density correction flag is set in step S107. If the answer is NO in step S107, the process operation returns to step S101. If the answer is YES in step S107, the above-described test mark groups are formed on the conveyor belt 6 in step S108. Subsequently, the CPU 21 determines if the position displacement correction flag is set in step S109. If the answer is YES in step S109, a predetermined position displacement detection operation is performed in step S110. Further, a position displacement adjustment operation is performed based on a position displacement detection value obtained in the position displacement detection operation. If the position displacement correction flag is not set in step S109, the process operation proceeds to step S111 without performing the position displacement detection operation in step S110.

Subsequently, the CPU 21 determines if the density correction flag is set in step S111. If the answer is YES in step S111, a predetermined density detection operation is performed in step S112. Further, a density adjustment operation is performed based on a density detection value obtained in the density detection operation. If the density correction flag is not set in step S111, the process operation ends without performing the density detection operation in step S112.

Figure 12:
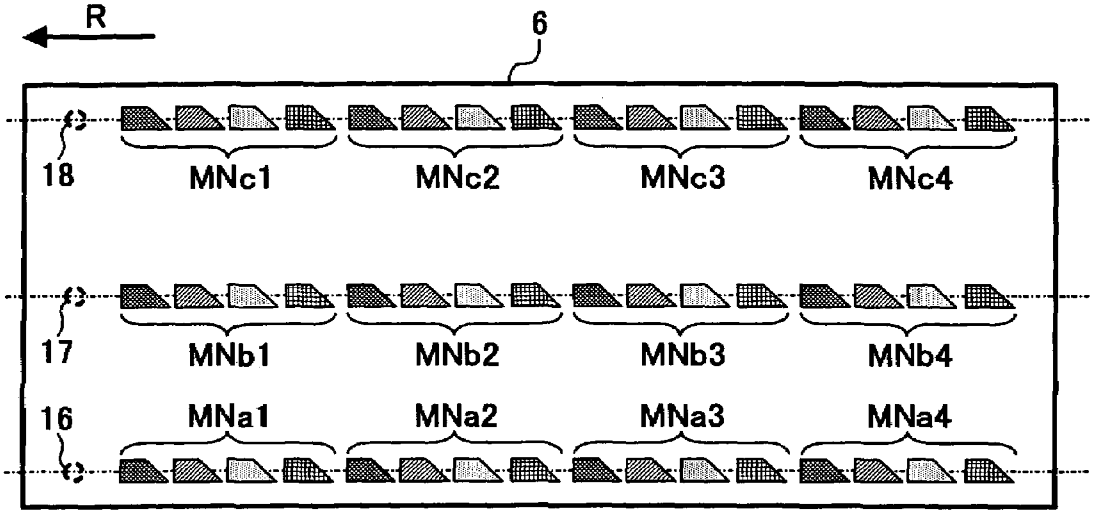
FIG. 12 is a plan view of exemplary test mark groups formed on the conveyor belt seen from above according to another embodiment of the present invention.

FIG. 12 illustrates exemplary test marks according to another embodiment of the present invention. In this embodiment, the position displacement detection in the main-scanning direction of the conveyor belt 6, the position displacement detection in the sub-scanning direction of the conveyor belt 6, and the density detection can be performed by using the test marks of FIG. 12.

Four groups of test marks are formed along a line extending in the conveying direction of the conveyor belt 6 at positions where each of the optical sensors 16, 17, and 18 can detect the four groups of test marks. Specifically, four groups of test marks "MNa1", "MNa2", "MNa3", and "MNa4" (hereafter may be referred to as "test marks to be detected by the optical sensor 16) are formed in a line to be detected by the optical sensor 16. Further, four groups of test marks "MNb1", "MNb2", "MNb3", and "MNb4" (hereafter may be referred to as "test marks to be detected by the optical sensor 17") are formed in a line to be detected by the optical sensor 17. Moreover, four groups of test marks "MNc1", "MNc2", "MNc3", and "MNc4" (hereafter may be referred to as "test marks to be detected by the optical sensor 18") are formed in a line to be detected by the optical sensor 18. As illustrated in FIG. 12, the test marks to be detected by the optical sensor 16, the test marks to be detected by the optical sensor 17, and the test marks to be detected by the optical sensor 18 are formed in parallel with each other.

Each of the test mark groups "MNa1", "MNa2", "MNa3", and "MNa4" to be detected by the optical sensor 16 includes linear edge elements (hereafter referred to as "vertical edge elements") that extend in the direction perpendicular to the conveying direction of the conveyor belt 6 and that are used for detecting position displacements of test marks in the sub-scanning direction. Each of the test mark groups "MNa1", "MNa2", "MNa3", and "MNa4" to be detected by the optical sensor 16 further includes diagonal linear edge elements (hereafter referred to as "diagonal edge elements") that extend diagonally, for example, by about forty-five degrees relative to the conveying direction of the conveyor belt 6. Moreover, each of the test mark groups "MNa1", "MNa2", "MNa3", and "MNa4" includes trapezoidal plane and solid elements used for detecting respective densities of black, yellow, cyan, and magenta test marks. The trapezoidal plane and solid element includes the vertical edge element as its one side and the diagonal edge element as its other side. The densities of the trapezoidal plane and solid elements are different from each other among the test mark groups "MNa1", "MNa2", "MNa3", and "MNa4". For example, the density of each of the plane elements of the test mark group "MNa1" is set to 10%, the density of each of the plane elements of the test mark group "MNa2" is set to 40%, the density of each of the plane elements of the test mark group "MNa3" is set to 80%, and the density of each of the plane elements of the test mark group "MNa4" is set to 100%.

The test mark groups "MNb1", "MNb2", "MNb3", and "MNb4" to be detected by the optical sensor 17 and the test mark groups "MNc1", "MNc2", "MNc3", and "MNc4" to be detected by the optical sensor 18 have substantially the same configurations as those of the test marks test mark groups "MNa1", "MNa2", "MNa3", and "MNa4" to be detected by the optical sensor 16.

Figure 13A:
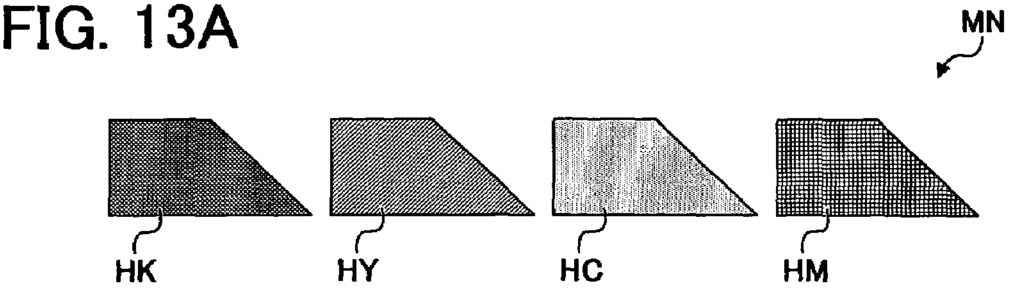
FIG. 13A is an enlarged view of one of the test mark groups of FIG. 12.

FIG. 13A is an enlarged view of one of the test mark groups "MNa1", "MNa2", "MNa3", and "MNa4", which is simply referred to as a test mark group "MN". The test mark group "MN" includes a trapezoidal black mark HK, a yellow mark "HY" that has the same shape and size as that of the black mark "HK" and that is located at a predetermined distance apart from the black mark "HK", a cyan mark "HC" that has the same shape and size as that of the black mark "HK" and that is located at a predetermined distance apart from the yellow mark "HY", and a magenta mark "HM" that has the same shape and size as that of the black mark "HK" and that is located at a predetermined distance apart from the cyan mark "HC". The black mark "HK" acts a reference mark used for detecting a position displacement of each of yellow, cyan, and magenta marks in the main-scanning direction and the sub-scanning direction of the conveyor belt 6.

Figure 13B:
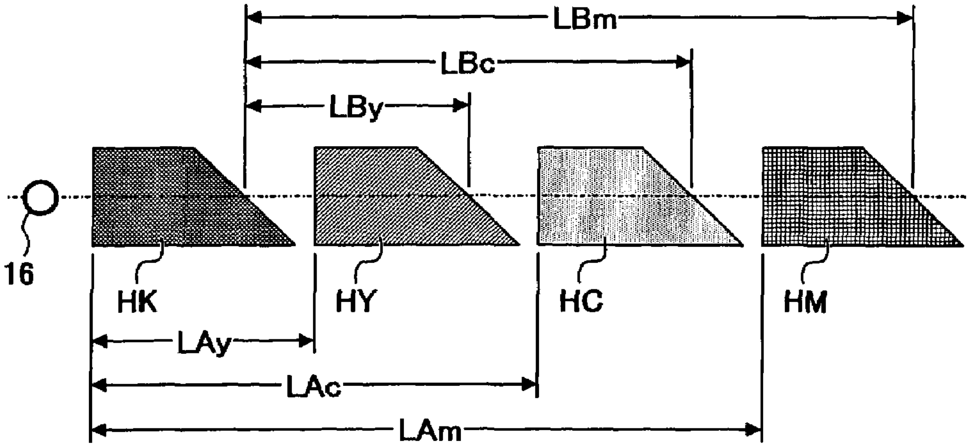
FIG. 13B is a view showing a condition that a center portion of the test mark group of FIG. 13A in a direction perpendicular to a conveying direction of the test mark group passes the optical sensor.

FIG. 13B is a view showing a condition that the center portion of the test mark group "MN" in the direction perpendicular to the conveying direction of the test mark group "MN" passes the optical sensor 16. As illustrated in FIG. 13B, a time period from when the vertical edge element of the black mark "HK" passes the optical sensor 16 to when the vertical edge element of the yellow mark "HY" passes the optical sensor 16 is indicated by a reference character "LAy". Further, a time period from when the diagonal edge element of the black mark "HK" passes the optical sensor 16 to when the diagonal edge element of the yellow mark "HY" passes the optical sensor 16 is indicated by a reference character "LBy". Because the time period "LAy" includes a position displacement component in the sub-scanning direction of the conveyor belt 6, the position displacement component in the sub-scanning direction can be obtained by calculating a difference between the value of the time period "LAy" and a default "D" of the value of the time period "LAy" (i.e., "LAy−D"). Further, because the time period "LBy" includes respective position displacement components in the main-scanning direction and in the sub-scanning direction of the conveyor belt 6, the position displacement component in the main-scanning direction can be obtained by calculating a difference between the value of the time period "LBy" and the value of the time period "LAy" (i.e., "LBy−LAy").

Likewise, assuming that a time period from when the vertical edge element of the black mark "HK" passes the optical sensor 16 to when the vertical edge element of the cyan mark "HC" passes the optical sensor 16 is referred to as an "LAc", the position displacement component in the sub-scanning direction of the conveyor belt 6 can be obtained by calculating a difference between the value of the time period "LAc" and a default "D" of the value of the time period "LAc" (i.e., "LAc−D"). Further, assuming that a time period from when the diagonal edge element of the black mark "HK" passes the optical sensor 16 to when the diagonal edge element of the cyan mark "HC" passes the optical sensor 16 is referred to as an "LBc", the position displacement component in the main-scanning direction of the conveyor belt 6 can be obtained by calculating a difference between the value of the time period "LBc" and the value of the time period "LAc" (i.e., "LBc−LAc").

Likewise, assuming that a time period from when the vertical edge element of the black mark "HK" passes the optical sensor 16 to when the vertical edge element of the magenta mark "HM" passes the optical sensor 16 is referred to as an "LAm", the position displacement component in the sub-scanning direction of the conveyor belt 6 can be obtained by calculating a difference between the value of the time period "LAm" and a default "D" of the value of the time period "LAm" (i.e., "LAm−D"). Further, assuming that a time period from when the diagonal edge element of the black mark "HK" passes the optical sensor 16 to when the diagonal edge element of the magenta mark "HM" passes the optical sensor 16 is referred to as an "LBm", the position displacement component in the main-scanning direction of the conveyor belt 6 can be obtained by calculating a difference between the value of the time period "LBm" and the value of the time period "LAm" (i.e., "LBm−LAm").

The respective densities of black, yellow, cyan, and magenta test marks can be obtained based on detection signals output from the optical sensor 16 during a period when the optical sensor 16 detects the respective trapezoidal plane and solid elements of the test marks "HK", "HY", "HC", and "HM".

FIG. 14A is an enlarged view of the black mark "HK", and FIG. 14B is a waveform of an output signal of the optical sensor 16. With reference to FIGS. 14A and 14B, the timing when the level of the output signal of the optical sensor 16 exceeds a threshold value "TH" is determined to represent the timing when the optical sensor 16 detects the vertical edge element of the black mark "HK". Further, the timing when the level of the output signal of the optical sensor 16 falls below the threshold value "TH" is determined to represent the timing when the optical sensor 16 detects the diagonal edge element of the black mark "HK".

FIG. 15A illustrates exemplary test marks according to another embodiment of the present invention. In this embodiment, the position displacement detection in the main-scanning direction of the conveyor belt 6, the position displacement detection in the sub-scanning direction of the conveyor belt 6, and the density detection can be performed by using the test marks of FIG. 15A. The test marks of FIG. 15A include a trapezoidal black mark "HKa", a trapezoidal yellow mark "HYa", a trapezoidal cyan mark "HCa", and a trapezoidal magenta mark "HMa" (hereafter may be collectively referred to as a test mark group "MNa"). The test mark group "MNa" of FIG. 15A is similar to the test mark group "MN" of FIG. 13A except that four sides of each of the black mark "HKa", the yellow mark "HYa", the cyan mark "HCa", and the magenta mark "HMa" are set to a predetermined density, for example, 100% high density.

FIG. 15B is a view showing a condition that the center portion of the test mark group "MNa" in the direction perpendicular to the conveying direction of the test mark group "MNa" passes the optical sensor 16. As illustrated in FIG. 15B, a time period from when a vertical edge element of the black mark "HKa" passes the optical sensor 16 to when a vertical edge element of the yellow mark "HYa" passes the optical sensor 16 is indicated by a reference character "LAya". Further, a time period from when a diagonal edge element of the black mark "HKa" passes the optical sensor 16 to when a diagonal edge element of the yellow mark "HYa" passes the optical sensor 16 is indicated by a reference character "LBya".

As described with reference to FIG. 13B, because the time period "LAya" includes a position displacement component in the sub-scanning direction of the conveyor belt 6, the position displacement component in the sub-scanning direction can be obtained by calculating a difference between the value of the time period "LAya" and a default "D" of the value of the time period "LAya" (i.e., "LAya−D"). Further, because the time period "LBya" includes respective position displacement components in the main-scanning direction and in the sub-scanning direction of the conveyor belt 6, the position displacement component in the main-scanning direction can be obtained by calculating a difference between the value of the time period "LBya" and the value of the time period "LAya" (i.e., "LBya−LAya").

The respective densities of black, yellow, cyan, and magenta test marks can be obtained based on detection signals output from the optical sensor 16 during a period when the optical sensor 16 detects the respective trapezoidal plane and solid elements of the test marks "HKa", "HYa", "HCa", and "HMa".

Figure 16A:
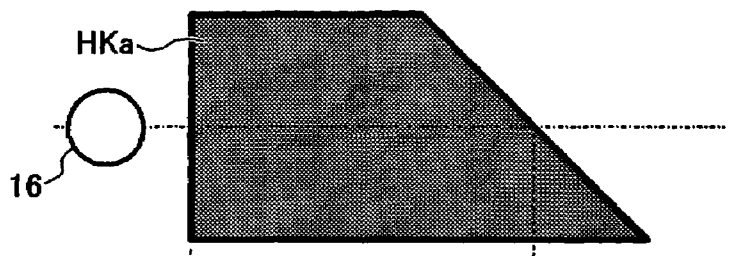
FIG. 16A is an enlarged view of one of test marks of the test mark group of FIG. 15A.
Figure 16B:
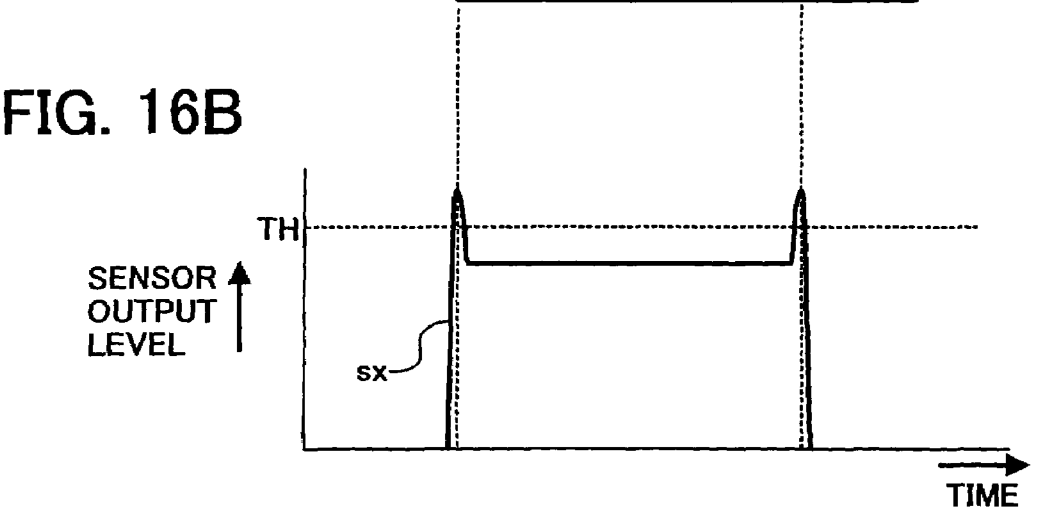
FIG. 16B is a diagram illustrating waveform of an output signal of the optical sensor.

FIG. 16A is an enlarged view of the black mark "HKa", and FIG. 16B is a waveform of an output signal of the optical sensor 16. As seen from FIG. 16B, when the optical sensor 16 detects the vertical edge element and the diagonal edge element of the black mark "HKa", the level of the output signal of the optical sensor 16 becomes a peak value. Thus, by using the test marks "HKa", "HYa", "HCa", and "HMa" of this embodiment, the timing when the optical sensor 16 detects the vertical edge element and the diagonal edge element of the test marks can be clearly determined.

Figure 17A:
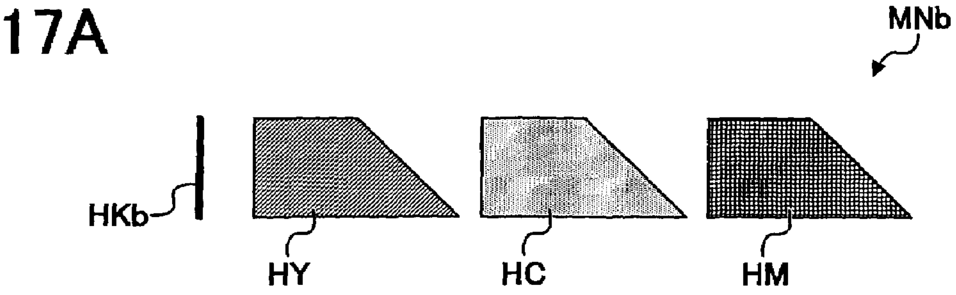
FIG. 17A is a plan view of an exemplary test mark group according to another embodiment of the present invention.

FIG. 17A illustrates exemplary test marks according to another embodiment of the present invention. As similarly described with reference to the test marks of FIGS. 13A and 15A, the position displacement detection in the main-scanning direction of the conveyor belt 6, the position displacement detection in the sub-scanning direction of the conveyor belt 6, and the density detection can be performed by using the test marks of FIG. 17A.

The test marks of FIG. 17A include a linear black mark "HKb" that constructs a linear edge element that extends in the direction perpendicular to the conveying direction of the conveyor belt 6 and that acts a reference mark used for detecting a position displacement in the sub-scanning direction. The density of the linear black mark "HKb" is set to a predetermined density, for example, 100% high density. The test marks of FIG. 17A further include the trapezoidal yellow mark "HY", the trapezoidal cyan mark "HC", and the trapezoidal magenta mark "HM" which are the same as those of the test mark group "MN" of FIG. 13A. Hereafter, the black mark "HKb", the yellow mark "HY", the cyan mark "HC", and the magenta mark "HM" may be collectively referred to as a test mark group "MNb".

Because the black mark "HKb" is used as a reference mark for detecting respective vertical edge elements and diagonal edge elements of the yellow mark "HY", the cyan mark "HC", and the magenta mark "HM", the position displacement detections of the yellow mark "HY", the cyan mark "HC", and the magenta mark "HM" are performed on the assumption that the position displacement of the black mark "HKb" in the sub-scanning direction is corrected.

Figure 17B:
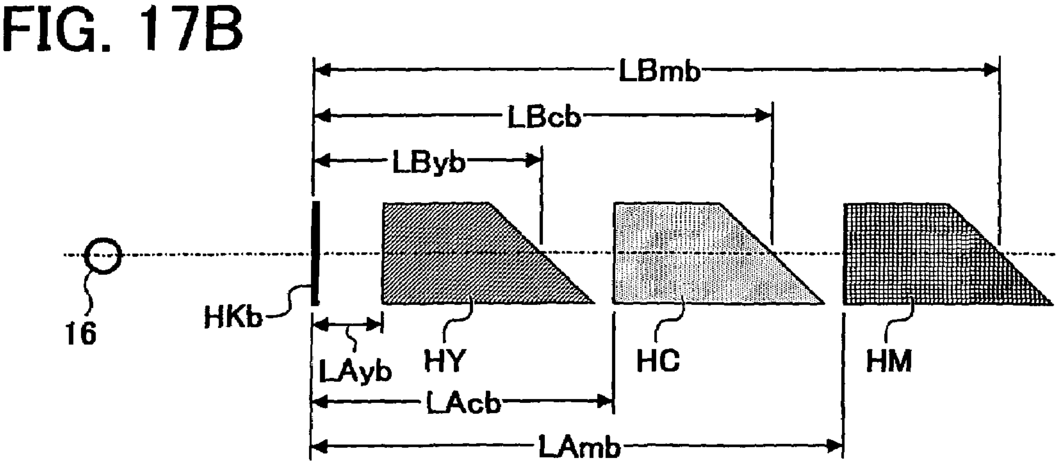
FIG. 17B is a view showing a condition that a center portion of the test mark group of FIG. 17A in a direction perpendicular to a conveying direction of the test mark group passes the optical sensor.

FIG. 17B is a view showing a condition that the center portion of the test mark group "MNb" in the direction perpendicular to the conveying direction of the test mark group "MNb" passes the optical sensor 16. As illustrated in FIG. 17B, a time period from when the black mark "HKb" passes the optical sensor 16 to when the vertical edge element of the yellow mark "HY" passes the optical sensor 16 is indicated by a reference character “LAyb”. Further, a time period from when the black mark “HKb” passes the optical sensor 16 to when the diagonal edge element of the yellow mark “HY” passes the optical sensor 16 is indicated by a reference character “LByb”. Because the time period “LAyb” includes a position displacement component in the sub-scanning direction of the conveyor belt 6, the position displacement component of the yellow mark “HY” in the sub-scanning direction can be obtained by calculating a difference between the value of the time period “LAyb” and a default “D” of the value of the time period “LAyb” (i.e., “LAyb−D”). Further, because the time period “LByb” includes a position displacement component in the main-scanning direction of the conveyor belt 6, the position displacement component of the yellow mark “HY” in the main-scanning direction can be obtained by calculating a difference between the value of the time period “LByb” and a default “D” of the value of the time period “LByb” (i.e., “LByb−D”).

Likewise, assuming that a time period from when the black mark “HKb” passes the optical sensor 16 to when the vertical edge element of the cyan mark “HC” passes the optical sensor 16 is referred to as an “LAcb”, the position displacement component of the cyan mark “HC” in the sub-scanning direction can be obtained by calculating a difference between the value of the time period “LAcb” and a default “D” of the value of the time period “LAcb” (i.e., “LAcb−D”). Further, assuming that a time period from when the black mark “HKb” passes the optical sensor 16 to when the diagonal edge element of the cyan mark “HC” passes the optical sensor 16 is referred to as an “LBcb”, the position displacement component of the cyan mark “HC” in the main-scanning direction can be obtained by calculating a difference between the value of the time period “LBcb” and a default “D” of the value of the time period “LBcb” (i.e., “LBcb−D”).

Likewise, assuming that a time period from when the black mark “HKb” passes the optical sensor 16 to when the vertical edge element of the magenta mark “HM” passes the optical sensor 16 is referred to as an “LAmb”, the position displacement component of the magenta mark “HM” in the sub-scanning direction can be obtained by calculating a difference between the value of the time period “LAmb” and a default “D” of the value of the time period “LAmb” (i.e., “LAmb−D”). Further, assuming that a time period from when the black mark “HKb” passes the optical sensor 16 to when the diagonal edge element of the magenta mark “HM” passes the optical sensor 16 is referred to as an “LBmb”, the position displacement component of the magenta mark “HM” in the main-scanning direction can be obtained by calculating a difference between the value of the time period “LBmb” and a default “D” of the value of the time period “LBmb” (i.e., “LBmb−D”).

The respective densities of yellow, cyan, and magenta test marks can be obtained based on detection signals output from the optical sensor 16 during a period when the optical sensor 16 detects the respective trapezoidal plane and solid elements of the test marks “HY”, “HC”, and “HM”.

In the present embodiment, the black mark “HKb” is formed from only the vertical edge element. Therefore, a time necessary for forming the group of test marks can be reduced, so that a total time spent for performing a detection operation for detecting position displacements can be reduced.

In the above-described embodiments of the present invention, a position displacement detection operation and an image density detection operation are performed by forming just one type of test marks instead of forming different types of test marks, that is, one type is for position displacement detection, and another type is for image density detection. Therefore, a time necessary for performing the position displacement detection operation and the image density detection operation can be reduced. Further, two types of optical sensors for detecting position displacement detecting test marks and for detecting density detecting test marks need not be provided. Thus, the color image forming apparatus of the present embodiments can efficiently perform a position displacement detection operation and an image density detection operation without increasing user’s waiting time and without incurring the increase of costs of the apparatus.

The present invention has been described with respect to the exemplary embodiments illustrated in the figures. However, the present invention is not limited to these embodiments and may be practiced otherwise.

The present invention has been described with respect to the tandem type color image forming apparatus in which toner images formed on the photosensitive drums 10*a*, 11*a*, 12*a*, and 13*a* are directly transferred to the transfer sheet 1 while being superimposed on one another. In this tandem type color image forming apparatus, a transfer sheet acts as an image carrier to which images of different colors are transferred while being superimposed on one another. However, the present invention can be applied to another tandem type color image forming apparatus in which toner images of different colors, which have been formed on the photosensitive drums 10*a*, 11*a*, 12*a*, and 13*a*, are transferred to a conveyor belt acting as an intermediate transfer element while being superimposed on one another by respective primary transfer units. Subsequently, a superimposed color image is transferred from the conveyor belt to a transfer sheet by a secondary transfer unit. In this tandem type color image forming apparatus, a conveyor belt acts as an image carrier to which images of different colors are transferred while being superimposed on one another.

Further, aspects of the present invention can be applied to any type of image forming apparatus, such as, a copying machine, printer, facsimile machine, etc. or a multi-functional image forming apparatus.

Numerous additional modifications and variations of the present invention are possible in light of the above teachings. It is therefore to be understood that within the scope of the appended claims, the present invention may be practiced otherwise than as specifically described herein.

What is claimed:

1. A color image forming apparatus comprising:

image forming units configured to form images of different colors on an image carrier;

a plurality of detectors configured to output detection signals; and a controller configured to receive the detection signals, wherein the image forming units are configured to form test marks of different colors on the image carrier in a conveying direction thereof at predetermined intervals, the test marks include linear position displacement detecting test marks, and density detecting test marks that include an area having a predetermined density and are adjacent to the linear position displacement detecting test marks, wherein the density detecting test marks correspond to the linear position displacement detecting test marks, and the linear position displacement testing marks are a part of the corresponding density detecting test marks, wherein the plurality of detectors are configured to detect the test marks and to output the detection signals based upon the detection of the test marks, and wherein the controller is configured to perform a detection operation for detecting position displacements of the linear position displacement detecting test marks in a scanning direction of the image carrier and to perform a detection operation for detecting densities of the density detecting test marks, based on the detection signals output from the plurality of detectors.

2. The apparatus according to claim 1, wherein:

the linear position displacement detecting test marks extend in a direction perpendicular to the conveying direction of the image carrier; and the controller is configured to perform the detection operation for detecting position displacements of the linear position displacement detecting test marks in a sub-scanning direction of the image carrier.

3. The apparatus according to claim 1, wherein:

the linear position displacement detecting test marks extend diagonally by predetermined degrees relative to the conveying direction of the image carrier; and the controller is configured to perform the detection operation for detecting position displacements of the linear position displacement detecting test marks in a main-scanning direction of the image carrier.

4. The apparatus according to claim 1, wherein:

the linear position displacement detecting test marks include first linear position displacement detecting test marks that extend in a direction perpendicular to the conveying direction of the image carrier, and second linear position displacement detecting test marks that extend diagonally by predetermined degrees relative to the conveying direction of the image carrier, and the controller is configured to perform the detection operation for detecting position displacements of the first linear position displacement detecting test marks in a sub-scanning direction of the image carrier and the second linear position displacement detecting test marks in a main-scanning direction of the image carrier.

5. The apparatus according to claim 1, wherein:

the linear position displacement detecting test marks are a side of the corresponding density detecting test marks.

6. The apparatus according to claim 5, wherein:

the linear position displacement detecting test marks are one side of the corresponding density detecting test marks which are four-sided.

7. A color image forming apparatus comprising:

tandem type image forming units configured to form images of different colors, respectively;

an image carrier configured to carry the images formed by the image forming units, the image forming units are disposed along a conveying direction of the image carrier; and transfer units configured to transfer the images of different colors formed by the image forming units to the image carrier while superimposing each of the images on one another, wherein the image carrier comprises a conveyor belt, the image forming units are configured to form test marks of different colors on the conveyor belt in a conveying direction of the conveyor belt at predetermined intervals, the test marks include linear position displacement detecting test marks of different colors and density detecting test marks of different colors, each of the density detecting test marks includes an area having a predetermined density and being adjacent to each of the linear position displacement detecting test marks, wherein the density detecting test marks correspond to the linear position displacement detecting test marks, and the linear position displacement testing marks are a part of the corresponding density detecting test marks, wherein the color image forming apparatus further comprises:

at least two detectors configured to detect the linear position displacement detecting test marks and the density detecting test marks and to output detection signals; and a controller configured to perform a detection operation for detecting position displacements of the linear position displacement detecting test marks in a scanning direction of the conveyor belt and to perform a detection operation for detecting densities of the density detecting test marks, based on the detection signals output from the at least two detectors.

8. The apparatus according to claim 7, wherein:

each of the linear position displacement detecting test marks extends in a direction perpendicular to the conveying direction of the conveyor belt; and the controller is configured to perform the detection operation for detecting position displacements of the linear position displacement detecting test marks in a sub-scanning direction of the conveyor belt which is parallel to the conveying direction of the conveyor belt.

9. The apparatus according to claim 7, wherein:

each of the linear position displacement detecting test marks extends diagonally by predetermined degrees relative to the conveying direction of the conveyor belt; and the controller is configured to perform the detection operation for detecting position displacements of the linear position displacement detecting test marks in a main-scanning direction of the conveyor belt which is perpendicular to the conveying direction of the conveyor belt.

10. The apparatus according to claim 7, wherein:

the linear position displacement detecting test marks include first linear position displacement detecting test marks of different colors and second linear position displacement detecting test marks of different colors, each of the first linear position displacement detecting test marks extends in a direction perpendicular to the conveying direction of the conveyor belt, and each of the second linear position displacement detecting test marks extends diagonally by predetermined degrees relative to the conveying direction of the conveyor belt;

the at least two detectors are configured to detect the first linear position displacement detecting test marks and the second linear position displacement detecting test marks; and the controller is configured to perform a detection operation for detecting position displacements of the first linear position displacement detecting test marks in a sub-scanning direction of the conveyor belt which is parallel to the conveying direction of the conveyor belt, and to perform a detection operation for detecting position displacements of the second linear position displacement detecting test marks in a main-scanning direction of the conveyor belt which is perpendicular to the conveying direction of the conveyor belt.

11. The apparatus according to claim 7, wherein the image forming units are configured to form a plurality of groups of the test marks of different colors, and each of the groups includes the test marks of all different colors.

12. The apparatus according to claim 11, wherein each of the groups of the test marks includes the density detecting test marks each including the area having the predetermined density, and the density of the each area is different in each group.

13. The apparatus according to claim 7, wherein the image carrier comprises a transfer sheet conveyed on the conveyor belt.

14. The apparatus according to claim 7, wherein:

the linear position displacement detecting test marks are a side of the corresponding density detecting test marks.

15. The apparatus according to claim 14, wherein:

the linear position displacement detecting test marks are one side of the corresponding density detecting test marks which are four-sided.

16. A method of controlling a color image forming apparatus that forms images of different colors and transfers the images of different colors to an image carrier, the method comprising:

forming test marks of different colors on the image carrier in a conveying direction thereof at predetermined intervals, the test marks including linear position displacement detecting test marks and density detecting test marks, the density detecting test marks including an area that has a predetermined density and is adjacent to the linear position displacement detecting test marks, wherein the density detecting test marks correspond to the linear position displacement detecting test marks, and the linear position displacement testing marks are a part of the corresponding density detecting test marks;

detecting the linear position displacement detecting test marks and the density detecting test marks and outputting detection signals; and performing a detection operation for detecting position displacements of the linear position displacement detecting test marks in a scanning direction of the image carrier and performing a detection operation for detecting densities of the density detecting test marks, based on the outputted detection signals.

17. The method according to claim 16, wherein:

the linear position displacement detecting test marks extend in a direction perpendicular to the conveying direction; and performing the detection operation for detecting position displacements of the linear position displacement detecting test marks is in a sub-scanning direction of the image carrier.

18. The method according to claim 16, wherein:

the linear position displacement detecting test marks extend diagonally by predetermined degrees relative to the conveying direction; and performing the detection operation for detecting position displacements of the linear position displacement detecting test marks is in a main-scanning direction of the image carrier.

19. The method according to claim 16, wherein:

the linear position displacement detecting test marks include first linear position displacement detecting test marks and second linear position displacement detecting test marks;

the first linear position displacement detecting test marks extend in a direction perpendicular to the conveying direction;

the second linear position displacement detecting test marks extend diagonally by predetermined degrees relative to the conveying direction;

performing the detection operation for detecting position displacements of the first linear position displacement detecting test marks is in a sub-scanning direction of the image carrier; and performing the detection operation for detecting position displacements of the second linear position displacement detecting test marks is in a main-scanning direction of the image carrier.

20. The method according to claim 16, wherein:

the linear position displacement detecting test marks are a side of the corresponding density detecting test marks.

21. The method according to claim 20, wherein:

the linear position displacement detecting test marks are one side of the corresponding density detecting test marks which are four-sided.

22. A method of controlling a color image forming apparatus that forms images of different colors and transfers the images of different colors to an image carrier while superimposing each of the images on one another, the method comprising:

forming test marks of different colors on a conveyor belt of the image carrier in a conveying direction of the conveyor belt at predetermined intervals, the test marks including linear position displacement detecting test marks of different colors and density detecting test marks of different colors, each of the density detecting test marks including an area that has a predetermined density and is adjacent to each of the linear position displacement detecting test marks, wherein the density detecting test marks correspond to the linear position displacement detecting test marks, and the linear position displacement testing marks are a part of the corresponding density detecting test marks;

detecting the linear position displacement detecting test marks and the density detecting test marks and outputting detection signals; and performing a detection operation for detecting position displacements of the linear position displacement detecting test marks in a scanning direction of the conveyor belt and performing a detection operation for detecting densities of the density detecting test marks, based on the outputted detection signals.

23. The method according to claim 22, wherein:

each of the linear position displacement detecting test marks extends in a direction perpendicular to the conveying direction of the conveyor belt; and performing the detection operation for detecting position displacements of the linear position displacement detecting test marks is in a sub-scanning direction of the conveyor belt which is parallel to the conveying direction of the conveyor belt.

24. The method according to claim 22, wherein:

each of the linear position displacement detecting test marks extends diagonally by predetermined degrees relative to the conveying direction of the conveyor belt; and performing the detection operation for detecting position displacements of the linear position displacement detecting test marks is in a main-scanning direction of the conveyor belt which is perpendicular to the conveying direction of the conveyor belt.

25. The method according to claim 22, wherein:

the linear position displacement detecting test marks include first linear position displacement detecting test marks of different colors and second linear position displacement detecting test marks of different colors;

each of the first linear position displacement detecting test marks extends in a direction perpendicular to the conveying direction of the conveyor belt;

each of the second linear position displacement detecting test marks extends diagonally by predetermined degrees relative to the conveying direction of the conveyor belt;

performing the detection operation for detecting position displacements of the first linear position displacement detecting test marks is in a sub-scanning direction of the conveyor belt which is parallel to the conveying direction of the conveyor belt; and performing the detection operation for detecting position displacements of the second linear position displacement detecting test marks is in a main-scanning direction of the conveyor belt which is perpendicular to the conveying direction of the conveyor belt.

26. The method according to claim 22, wherein the forming comprises forming a plurality of groups of the test marks of different colors, and each of the groups includes the test marks of all different colors.

27. The method according to claim 26, wherein each of the groups of the test marks includes the density detecting test marks each including the area having the predetermined density, and the density of the each area is different in each group.

28. The method according to claim 22, wherein the image carrier comprises a transfer sheet conveyed on the conveyor belt.

29. The method according to claim 22, wherein:

the linear position displacement detecting test marks are a side of the corresponding density detecting test marks.

30. The method according to claim 29, wherein:

the linear position displacement detecting test marks are one side of the corresponding density detecting test marks which are four-sided.

* * * * *